United States Patent
Chin et al.

(10) Patent No.: US 12,469,745 B2
(45) Date of Patent: Nov. 11, 2025

(54) CONDUCTIVE STRUCTURES WITH BOTTOM-LESS BARRIERS AND LINERS

(71) Applicant: Taiwan Semiconductor Manufacturing Company, Ltd., Hsinchu (TW)

(72) Inventors: Shu-Cheng Chin, Hsinchu (TW); Ming-Yuan Gao, Hsinchu (TW); Chun-kai Chang, Hsinchu (TW); Chen-Yi Niu, Taipei (TW); Hsin-Ying Peng, Hsinchu (TW); Chi-Feng Lin, Hsinchu (TW); Hung-Wen Su, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 764 days.

(21) Appl. No.: 17/652,593

(22) Filed: Feb. 25, 2022

(65) Prior Publication Data
US 2023/0029867 A1    Feb. 2, 2023

Related U.S. Application Data

(60) Provisional application No. 63/203,767, filed on Jul. 30, 2021.

(51) Int. Cl.
*H01L 21/768*    (2006.01)
*H01L 23/522*    (2006.01)
*H01L 23/532*    (2006.01)

(52) U.S. Cl.
CPC .. *H01L 21/76844* (2013.01); *H01L 21/76807* (2013.01); *H01L 21/7684* (2013.01);
(Continued)

(58) Field of Classification Search
CPC ......... H01L 21/76844; H01L 21/76807; H01L 21/7684; H01L 21/76846; H01L 21/76849;
(Continued)

(56) References Cited

U.S. PATENT DOCUMENTS 6,610,594 B2 * 8/2003 Apelgren .......... H01L 21/76834
                                                    257/E21.248
9,704,798 B2 * 7/2017 Govindaraju ....... H01L 23/5226
(Continued)

FOREIGN PATENT DOCUMENTS

TW         202114161 A      4/2021

*Primary Examiner* — Jonathan Han
(74) *Attorney, Agent, or Firm* — Harrity & Harrity, LLP

(57) ABSTRACT

A blocking material is selectively deposited on a bottom surface of a back end of line (BEOL) conductive structure such that a barrier layer is selectively deposited on sidewalls of the BEOL conductive structure but not the bottom surface. The blocking material is etched such that copper from a conductive structure underneath is exposed, and a ruthenium layer is deposited on the barrier layer but less ruthenium is deposited on the exposed copper. Accordingly, the barrier layer prevents diffusion of metal ions from the BEOL conductive structure and is substantially absent from the bottom surface as compared to the sidewalls in order to reduce contact resistance. Additionally, the ruthenium layer reduces surface roughness within the BEOL conductive structure and is thinner at the bottom surface as compared to the sidewalls in order to reduce contact resistance.

20 Claims, 20 Drawing Sheets

(52) U.S. Cl.
CPC .. *H01L 21/76846* (2013.01); *H01L 21/76849* (2013.01); *H01L 21/76877* (2013.01); *H01L 23/5226* (2013.01); *H01L 23/53238* (2013.01)

(58) Field of Classification Search
CPC ........... H01L 21/76877; H01L 23/5226; H01L 23/53238; H01L 2221/1063
See application file for complete search history.

(56) References Cited

U.S. PATENT DOCUMENTS

| | | | |
|---|---|---|---|
| 9,786,553 B1* | 10/2017 | Yang | H01L 21/76843 |
| 11,189,660 B2 | 11/2021 | Hsu et al. | |
| 2004/0121616 A1 | 6/2004 | Satta et al. | |
| 2018/0130702 A1* | 5/2018 | Patil | H01L 23/53209 |
| 2020/0013626 A1 | 1/2020 | Longrie et al. | |
| 2020/0273743 A1 | 8/2020 | Cheng et al. | |
| 2022/0028795 A1* | 1/2022 | Xu | H01L 21/76846 |

* cited by examiner

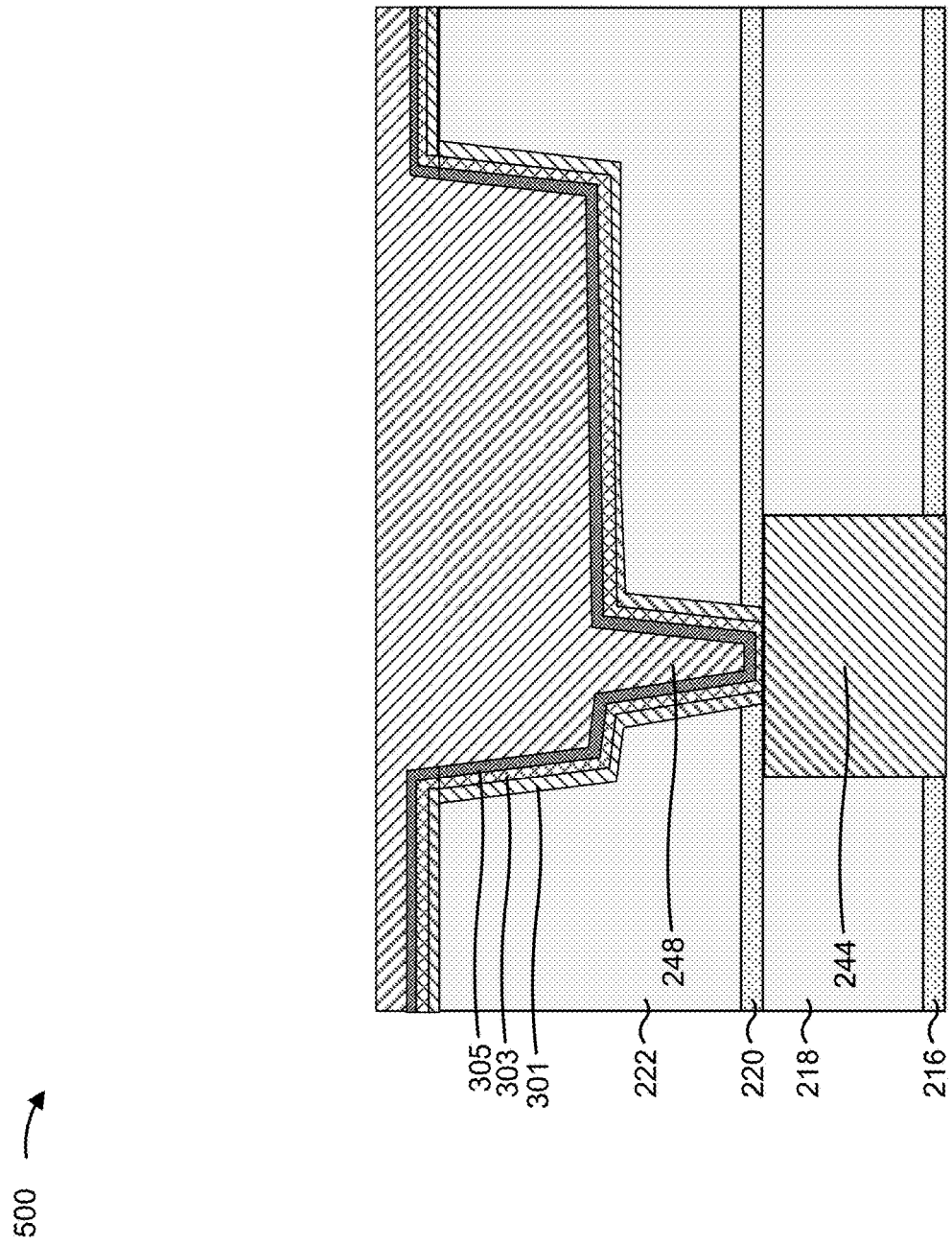

CONDUCTIVE STRUCTURES WITH BOTTOM-LESS BARRIERS AND LINERS

CROSS-REFERENCE TO RELATED APPLICATION

This Patent Application claims priority to U.S. Provisional Patent Application No. 63/203,767, filed on Jul. 30, 2021, and entitled "CONDUCTIVE STRUCTURE LINERS AND METHODS OF FORMING THE SAME." The disclosure of the prior Application is considered part of and is incorporated by reference into this Patent Application.

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5I are diagrams of an example implementation described herein.

DETAILED DESCRIPTION

Figure 1:
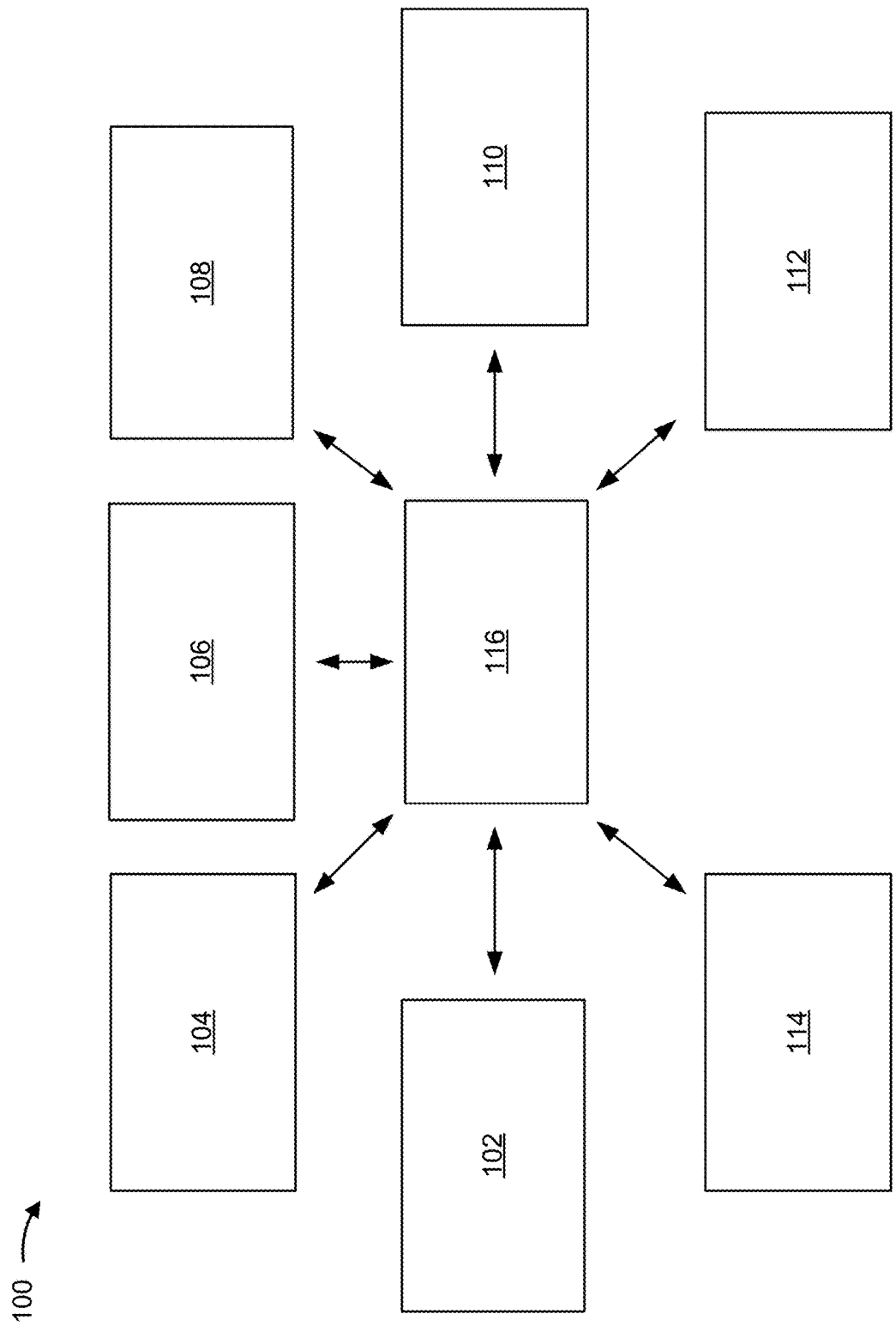
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper is often used for back end of line (BEOL) metallization layers and vias (also referred to as M1, M2, or M3 interconnects or metallization layers) or for middle end of line (MEOL) contact plugs (also referred to as M0 interconnects or metallization layers) due to low contact resistance and sheet resistance relative to other conductive materials, such as aluminum (Al). Lower resistivity provides lower resistance/capacitance (RC) time constants and faster propagation of signals across an electronic device. However, copper also has a high diffusion (or electromigration) rate, which can cause copper ions to diffuse into surrounding dielectric material. This diffusion results in an increase in resistivity for BEOL metallization layers and vias (or for MEOL contact plugs). Increased resistivity can decrease electrical performance of an electronic device. Moreover, diffusion may result in copper ions migrating into other BEOL layers and/or front end of line (FEOL) layers, such as source or drain interconnects (also referred to as source/drain vias or VDs) and/or gate interconnects (also referred to as gate vias or VGs), which can cause semiconductor device failures and reduced manufacturing yield. Accordingly, barrier layers (such as titanium nitride (TiN), tantalum nitride (TaN), and/or another type of barrier layer) may be deposited to prevent diffusion. However, the barrier layers increase contact resistance when deposited at an interface between BEOL layers or between an M1 layer and an M0 interconnect, which decreases electrical performance of the electronic device. In order to prevent diffusion but reduce the contact resistance caused by the barrier layer, a blocking material may be used to reduce deposition of the barrier layer at the bottom surface of the BEOL conductive structure.

Copper has increased surface roughness with barrier layers, however, which increases sheet resistance of the BEOL conductive structure. Accordingly, a ruthenium (Ru) layer may be deposited on the barrier layer in order to reduce surface roughness of the BEOL conductive structure. However, ruthenium also increases contact resistance when deposited at an interface between BEOL layers or between an M1 layer and an M0 interconnect. In order to reduce surface roughness but also reduce the contact resistance caused by the ruthenium layer, a blocking material may be used to reduce deposition of the ruthenium layer at the bottom surface of the BEOL conductive structure.

Using multiple blocking processes, however, results in greater impurities on the sidewalls of the BEOL conductive structure. Generally, at least some blocking material is deposited over the sidewalls in addition to the bottom surface. This blocking material reduces electrical performance of the BEOL conductive structure. Additionally, the blocking material is often deposited at bottoms of the sidewalls, which reduces manufacturing yield and reliability of the BEOL conductive structure because corners at the bottoms are weak points with weak adhesion such that the blocking material can cause electrical failure of the device including the BEOL conductive structure.

Some implementations described herein provide techniques and apparatuses for selectively depositing a blocking material on a bottom surface of a BEOL conductive structure such that a barrier layer is selectively deposited on sidewalls of the BEOL conductive structure and not on the bottom surface. The blocking material is etched such that copper from a conductive structure underneath is exposed. Accordingly, a ruthenium layer is deposited on the barrier layer with less ruthenium material on the exposed copper. The barrier layer prevents diffusion of metal ions from the BEOL conductive structure and is substantially absent from the bottom surface as compared to the sidewalls in order to reduce contact resistance. Additionally, the ruthenium layer reduces surface roughness within the BEOL conductive structure and is thinner at the bottom surface as compared to the sidewalls in order to reduce contact resistance.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2A:
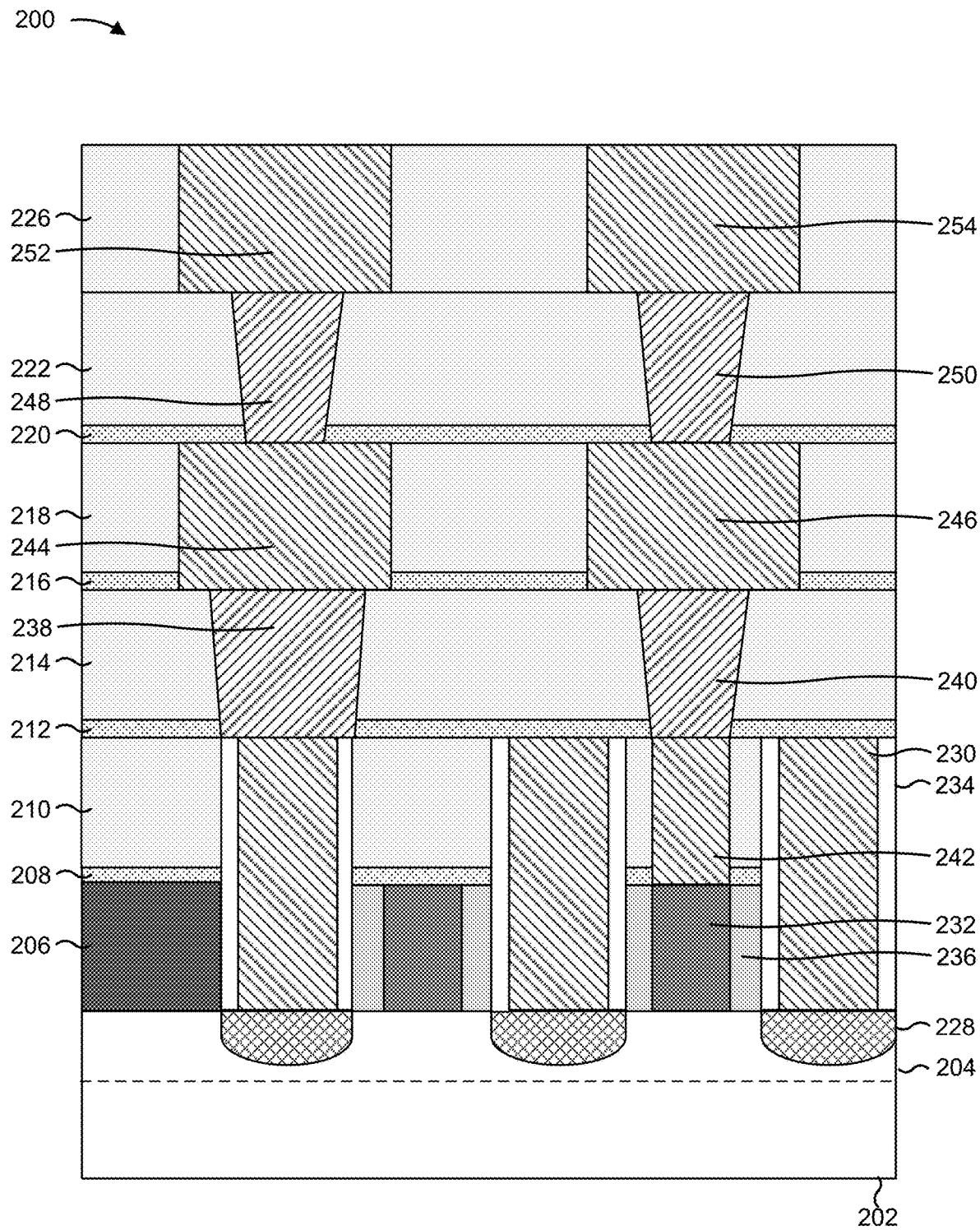
FIGS. 2A-2D are diagrams of example semiconductor structures described herein.

FIG. 2A is a diagram of a portion of an example device 200 described herein. Device 200 includes an example of a memory device, a logic device, a processor, an input/output device, or another type of semiconductor device that includes one or more transistors.

The device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, and 220 includes a layer of material that is configured to permit various portions of the device 200 (or the layers included therein) to be selectively etched or protected from etching to form one or more of the structures included in the device 200.

As further shown in FIG. 2A, the device 200 includes a plurality of epitaxial (epi) regions 228 that are grown and/or otherwise formed on and/or around portions of a fin structure 204 of a substrate 202. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the device 200.

The epitaxial regions 228 are electrically connected to metal source or drain contacts 230 of the transistors included in the device 200. The metal source or drain contacts (MDs) 230 include cobalt (Co), ruthenium (Ru), tungsten (W), and/or another conductive or metal material. The transistors further include gates 232 (MGs), which are formed of a polysilicon material, a metal (e.g., tungsten (W) or another metal), and/or another type of conductive material. In some implementations, the gates 232 may comprise multiple layers of material, such as multiple layers of metal or multiple layers including at least one polysilicon layer and at least one metal layer, among other examples. The metal source or drain contacts 230 and the gates 232 are electrically isolated by one or more sidewall spacers, including spacers 234 on each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2A, the metal source or drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The metal source or drain contacts 230 are electrically connected to source or drain interconnects 238 (e.g., source or drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2A, the interconnects 238 and 240 are electrically connected to a plurality of MEOL and BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 includes additional metallization layers and/or vias that connect the device 200 to a package.

Figure 2B:
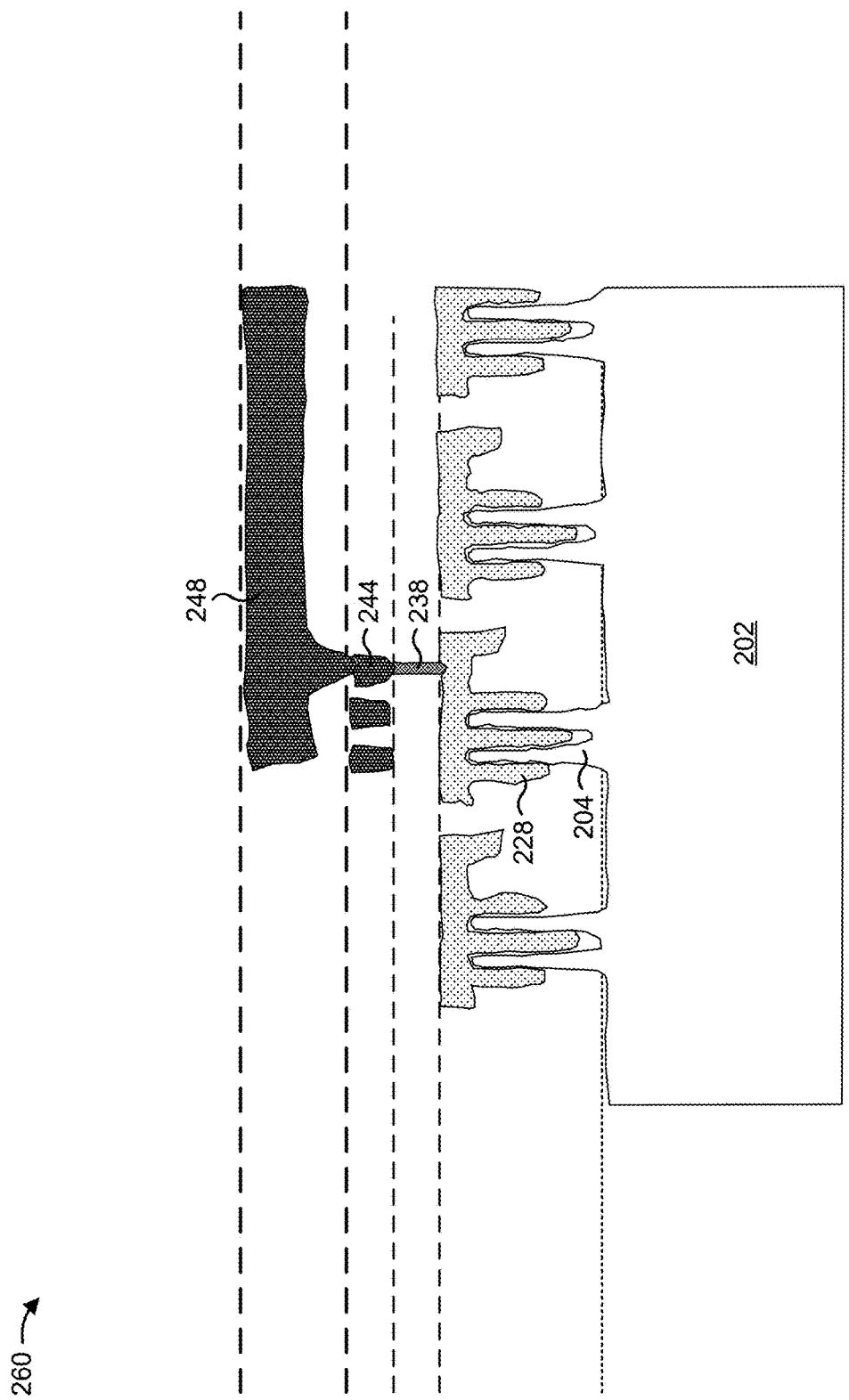

FIG. 2B is a diagram of a portion of an example device 260 described herein. Device 260 includes an example of a memory device, a logic device, a processor, an input/output device, or another type of semiconductor device that includes one or more transistors.

Device 260 is similar to device 200. In example device 260, the epitaxial regions 228 are grown over the fin structure 204. Additionally, as described above, the interconnect 238 functions as a VD (in other implementations, interconnect 238 functions as a VG for a gate formed over the fin structure 204), and the conductive structure 244 functions as an M0 metallization layer. In some implementations, the conductive structure 244 is a single damascene interconnect. Additionally, the conductive structure 248 functions as an Mx metallization layer (where x represents a positive integer). In some implementations, as shown in FIG. 2B and described herein, the conductive structure 248 is a dual damascene interconnect.

Figure 2C:
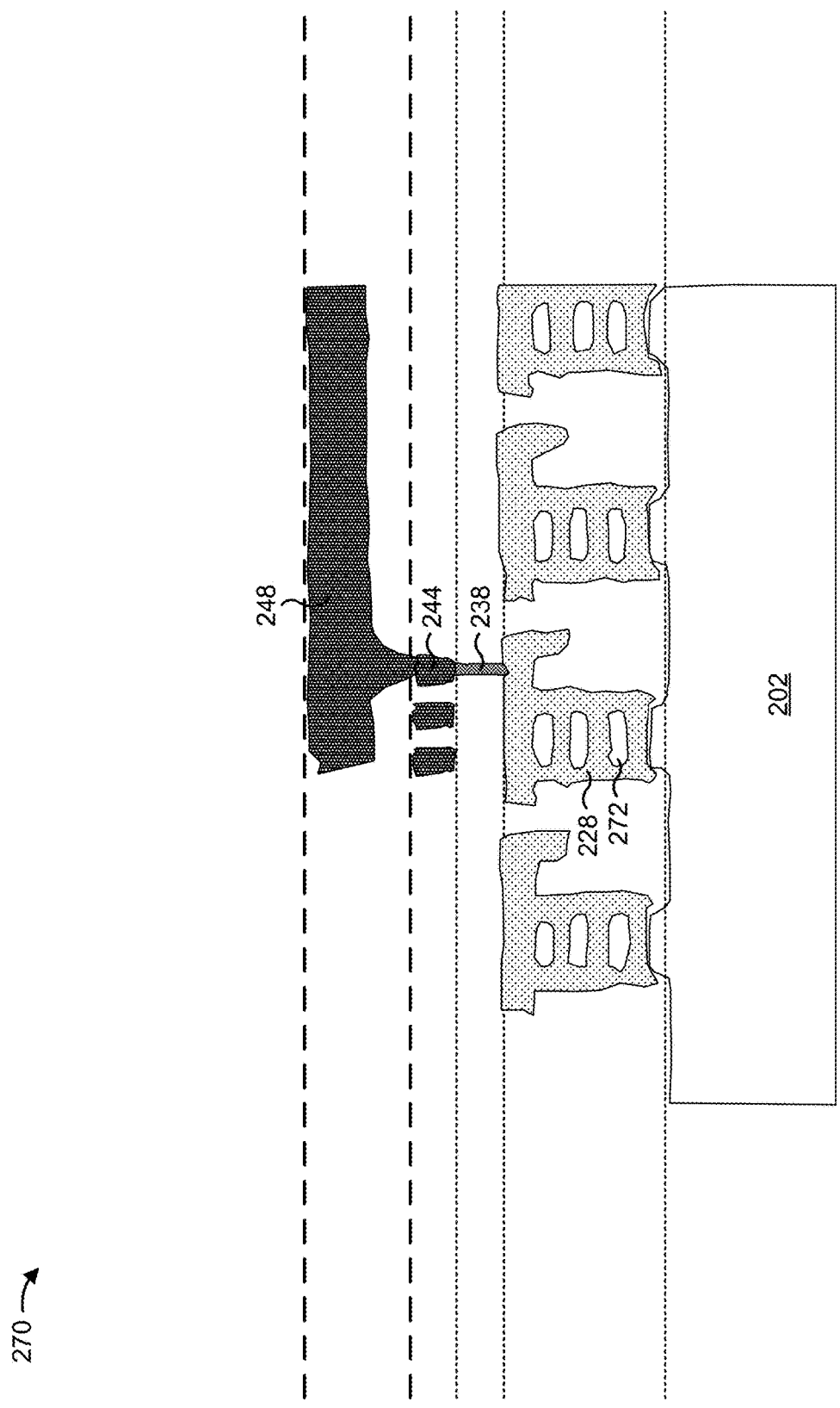

FIG. 2C is a diagram of a portion of an example device 270 described herein. Device 270 includes an example of a memory device, a logic device, a processor, an input/output device, or another type of semiconductor device that includes one or more transistors. Device 270 is similar to device 260. In example device 270, the epitaxial regions 228 are grown around nano-sheets 272 rather than over fins.

Figure 2D:
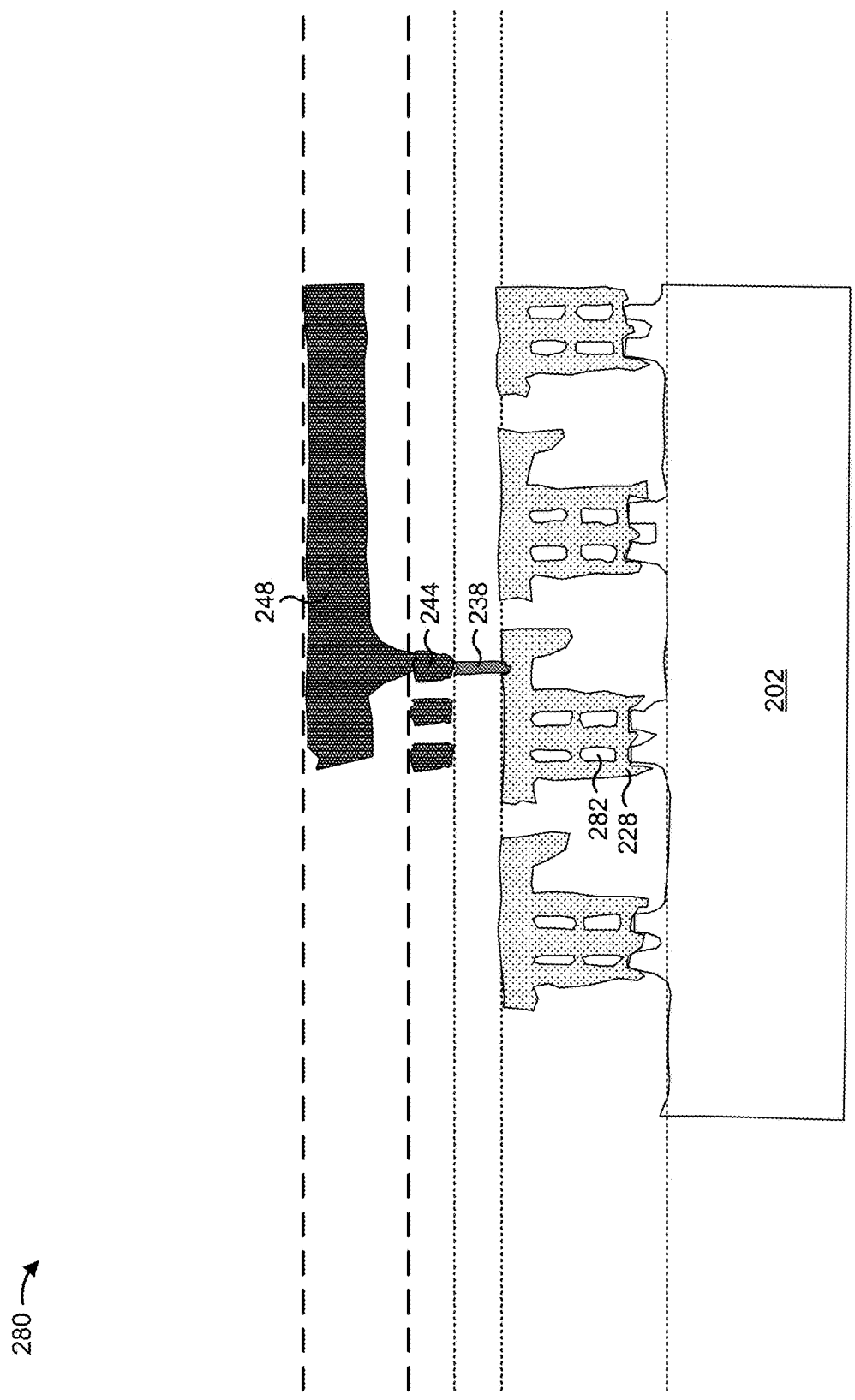

FIG. 2D is a diagram of a portion of an example device 280 described herein. Device 280 includes an example of a memory device, a logic device, a processor, an input/output device, or another type of semiconductor device that includes one or more transistors. Device 280 is similar to device 260. In example device 280, the epitaxial regions 228 are grown around nano-wires 282 rather than over fins.

As indicated above, FIGS. 2A-2D are provided as examples. Other examples may differ from what is described with regard to FIGS. 2A-2D.

Figure 3A:
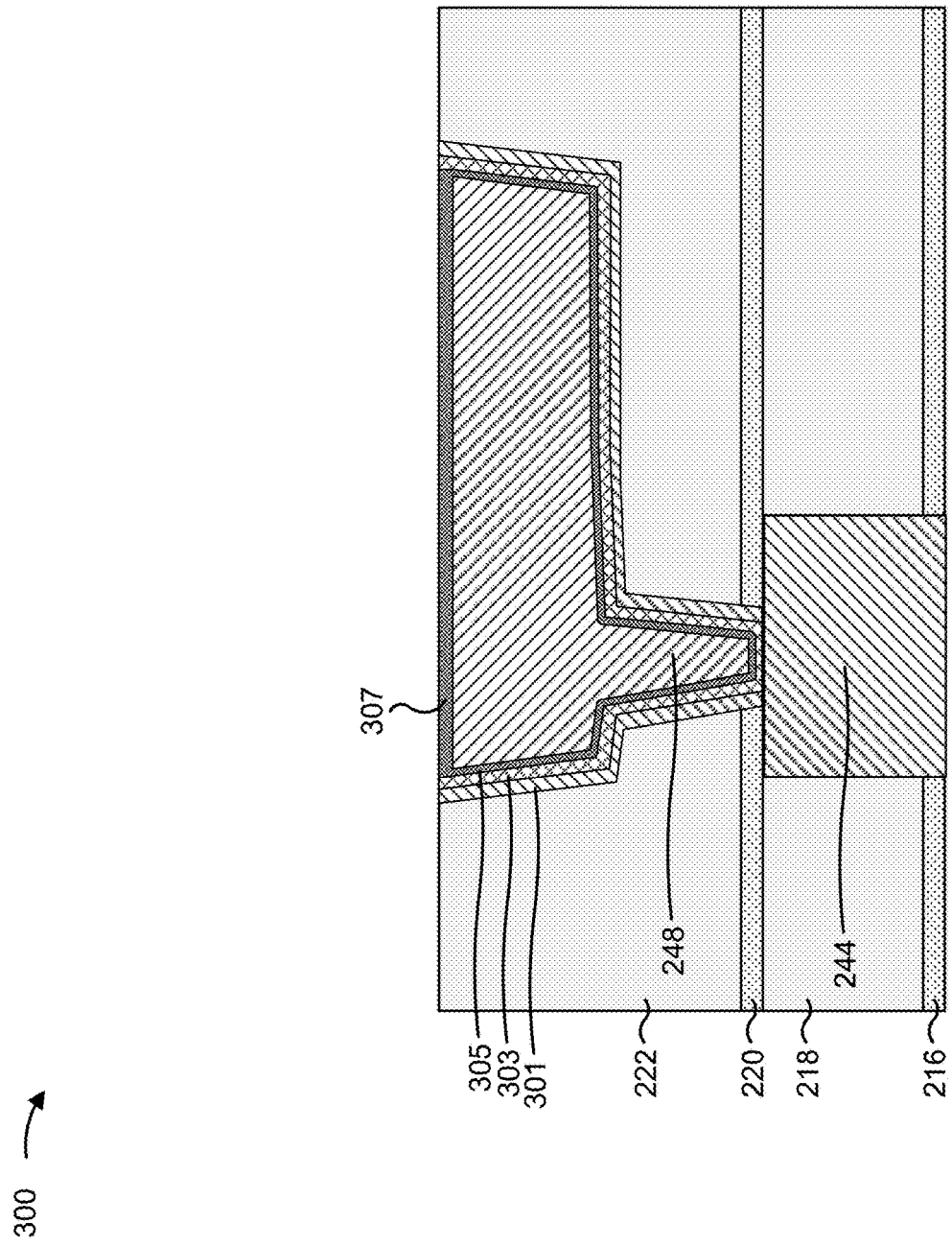
FIGS. 3A and 3B are diagrams of an example semiconductor structure described herein.

FIG. 3A is a diagram of an example semiconductor structure 300 described herein. The semiconductor structure 300 includes a conductive structure 248 that is formed with a barrier layer 301, a first liner layer 303, and a second liner layer 305 over a conductive structure 244. Although described using the conductive structure 248 over the conductive structure 244 that connects to a source/drain contact 230 that is over source/drain 228, the description similarly applies to conductive structure 250 over a conductive structure 246 that connects to a gate contact 242 that is over gate 232. Additionally, or alternatively, the description similarly applies to higher-layer metallization layers in a BEOL other than the conductive structure 248 and/or the conductive structure 250 (or interconnects in an MEOL when the interconnects comprise copper).

As shown in FIG. 3A, the conductive structure 248 may be formed in a dielectric layer 222 above an ESL 220. For example, the dielectric layer 222 may include silicon oxycarbide (SiOC). The ESL 220 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 220 includes a plurality of ESL layers stacked together to function as an etch stop. The conductive structure 248 is electrically connected to the conductive structure 244 that is formed in a dielectric layer 218 above an ESL 216. For example, the dielectric layer 218 may include silicon oxycarbide (SiOC). The ESL 216 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$).

In some implementations, the conductive structure 248 is formed in a recessed portion (e.g., recessed portion 501 as described in connection with FIGS. 5A-5I). Sidewalls of the recessed portion may form an angle from approximately 84 degrees to approximately 90 degrees. Selecting an angle of at least 84 degrees allows the conductive structure 248 to remain relatively narrow and conduct current faster. Selecting an angle of no more than 90 degrees allows for formation of material on sidewalls of the recessed portion.

In some implementations, as shown in FIG. 3A, the conductive structure 248 has a dual damascene profile such that the bottom surface includes at least a first portion that is lower in the dielectric layer 222 relative to a second portion. As an alternative, and as described in connection with FIG. 4A, the conductive structure 248 has a single damascene profile.

The barrier layer 301 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 301 helps prevent diffusion of copper atoms from the conductive structure 248 to other layers. The barrier layer 301 may have a thickness in a range from approximately 7 Ångstroms (Å) to approximately 15 Å. By selecting a thickness of at least 7 Å, the barrier layer 301 is thick enough to prevent copper diffusion from the conductive structure 248. By selecting a thickness of no more than 15 Å, the barrier layer 301 is thin enough such that the contact resistance between the conductive structure 248 and the conductive structure 244 is not significantly increased. Selecting a thickness of no more than 15 Å also shortens an amount of time, power, and chemicals consumed to deposit the barrier layer 301.

As described in connection with FIGS. 5A-5I, the barrier layer 301 may be formed using a liner block process. Accordingly, the barrier layer 301 may be substantially absent from a bottom surface of the recessed portion (e.g., the recessed portion 501) as compared with sidewalls of the recessed portion. As used herein, a substance is "substantially absent" from a surface when over 50% of the surface is characterized by a non-detectable (e.g., via transmission electron microscopy (TEM), energy dispersive x-ray analysis (EDX), and/or another similar technique) amount of the substance. Because the barrier layer 301 is substantially absent from the bottom surface, the contact resistance between the conductive structure 248 and the conductive structure 244 is not significantly increased. For example, the barrier layer 301 may have a thickness less than 2 Å at the bottom surface.

In some implementations, the barrier layer 301 is adjacent to the first liner layer 303. The first liner layer 303 may include a ruthenium material to improve copper flow when forming the conductive structure 248. A ratio of a thickness of the barrier layer 301 to a thickness of the first liner layer 303 may be in a range from approximately 0.4 to approximately 3.0. Selecting a ratio of at least 0.4 ensures that the barrier layer 301 is thin enough such that the contact resistance between the conductive structure 248 and the conductive structure 244 is not significantly increased and/or the first liner layer 303 is thick enough to improve copper flow. Selecting a ratio of no more than 3.0 ensures that the barrier layer 301 is thick enough to prevent copper diffusion from the conductive structure 248 and/or the first liner layer 303 is thin enough such that the contact resistance between the conductive structure 248 and the conductive structure 244 is not significantly increased. For example, the first liner layer 303 may have a thickness from approximately 5 Å to approximately 18 Å.

As described in connection with FIGS. 5A-5I, the first liner layer 303 may be associated with a slower nucleation rate over copper (e.g., an exposed portion of the conductive structure 244) as compared with the barrier layer 301. For example, the first liner layer 303 may grow approximately three times faster on TaN as compared with Cu. Accordingly, the first liner layer 303 may be thinner at a bottom surface of the recessed portion (e.g., the recessed portion 501) as compared with sidewalls of the recessed portion. In some implementations, a ratio of a thickness of the first liner layer 303 over the bottom surface to a thickness of the first liner layer 303 at the sidewalls may be in a range from approximately 0.4 to approximately 0.6 (such that the thickness of the first liner layer 303 over the bottom surface is no more than 60% of the thickness of the first liner layer 303 at the sidewalls). Selecting a ratio of at least 0.4 ensures that the first liner layer 303 is thick enough at the bottom surface to improve copper flow into the recessed portion. Selecting a ratio of no more than 0.6 ensures that the first liner layer 303 is thin enough at the bottom surface such that contact resistance between the conductive structure 248 and the conductive structure 244 is not significantly increased. For example, the first liner layer 303 may have a thickness from approximately 3 Å to approximately 8 Å at the bottom surface as compared with a thickness from approximately 5 Å to approximately 18 Å at the sidewalls.

Additionally, in some implementations and as shown in FIG. 3A, the first liner layer 303 is adjacent to the second liner layer 305. The second liner layer 305 may include a cobalt material to help sheet resistance of the conductive structure 248 in combination with a ruthenium material to help prevent diffusion of cobalt atoms to other layers. A ratio of a thickness of the second liner layer 305 to a thickness of the first liner layer 303 may be in a range from approximately 0.25 to approximately 3.0. Selecting a ratio of at least 0.25 ensures that the second liner layer 305 is thin enough such that the contact resistance between the conductive structure 248 and the conductive structure 244 is not significantly increased and/or the first liner layer 303 is thick enough to improve copper flow. Selecting a ratio of no more than 3.0 ensures that the second liner layer 305 is thick enough such that sheet resistance of the conductive structure 248 is improved and/or the first liner layer 303 is thin enough such that contact resistance between the conductive structure 248 and the conductive structure 244 is not significantly increased. For example, the second liner layer 305 may have a thickness from approximately 5 Å to approximately 15 Å on the bottom surface and/or on the sidewalls of the recessed portion.

Additionally, or alternatively, and as further shown in FIG. 3A, the conductive structure 248 includes a cobalt cap 307. The cobalt cap 307 may have a depth included in a range from approximately 20 Å to approximately 40 Å. By selecting a depth of at least 20 Å, the cobalt is protected from overgrowth by a corresponding ESL (e.g., ESL 212, ESL 216, ESL 220, or another ESL) during epitaxial growth of the corresponding ESL. Preventing epitaxial overgrowth of the corresponding ESL reduces contact resistance at the cobalt cap 307. By selecting a depth of no more than 40 Å, the cobalt does not significantly increase contact resistance. Selecting a depth of no more than 40 Å also shortens an amount of time, power, and chemicals consumed to deposit the cobalt.

Figure 3B:
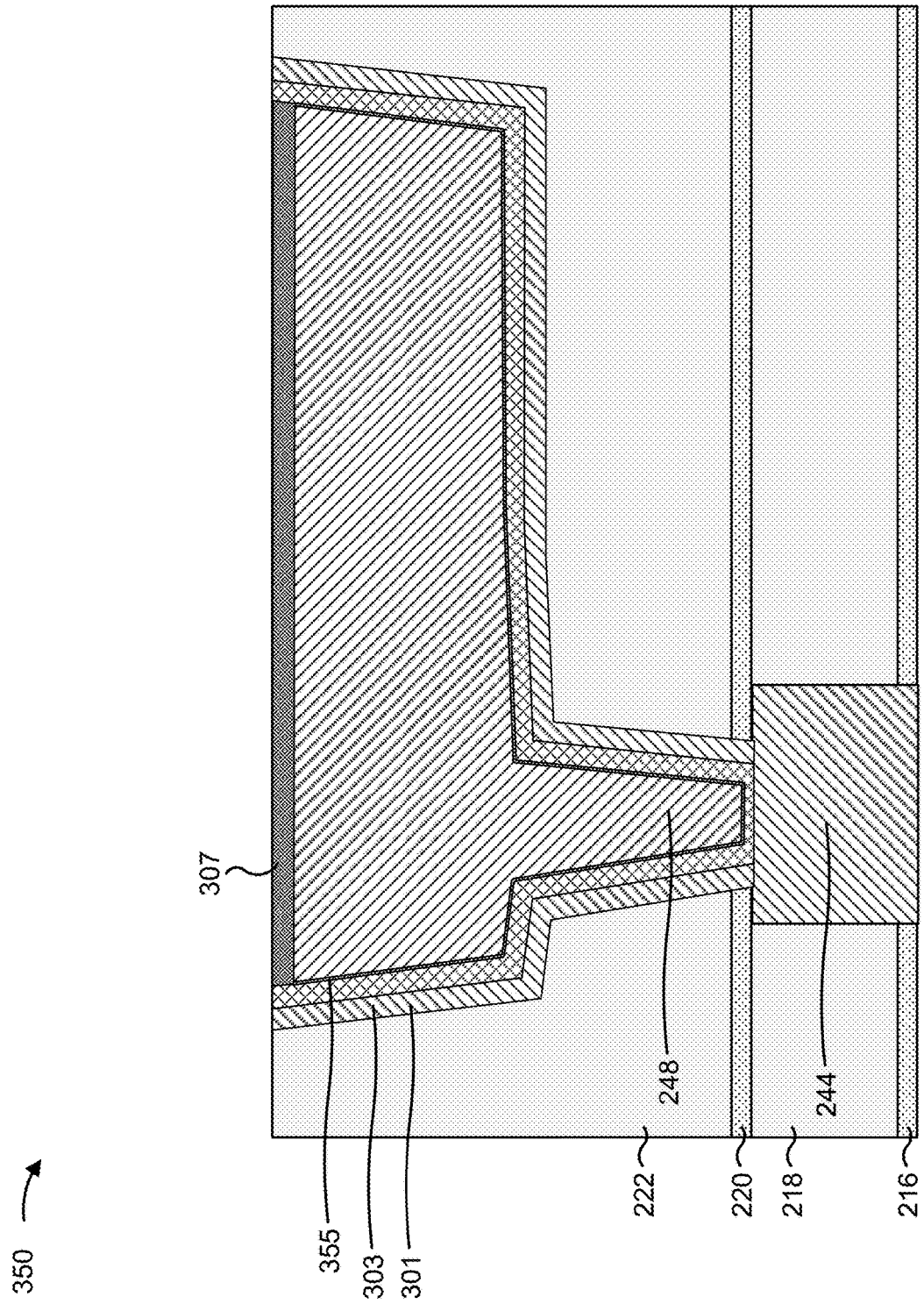

FIG. 3B is a diagram of an example semiconductor structure 350 described herein. The semiconductor structure 350 is similar to semiconductor structure 300 of FIG. 3A; however, the semiconductor structure 350 includes a layer 355 of diffused cobalt atoms in lieu of the second liner layer 305. For example, cobalt atoms may diffuse from the cobalt cap 307 and surround the copper of the conductive structure 248. As a result, semiconductor structure 350 is faster to manufacture and uses fewer raw materials during manufacturing as compared with semiconductor structure 300.

As indicated above, FIGS. 3A and 3B are provided as examples. Other examples may differ from what is described with regard to FIGS. 3A and 3B.

Figure 4A:
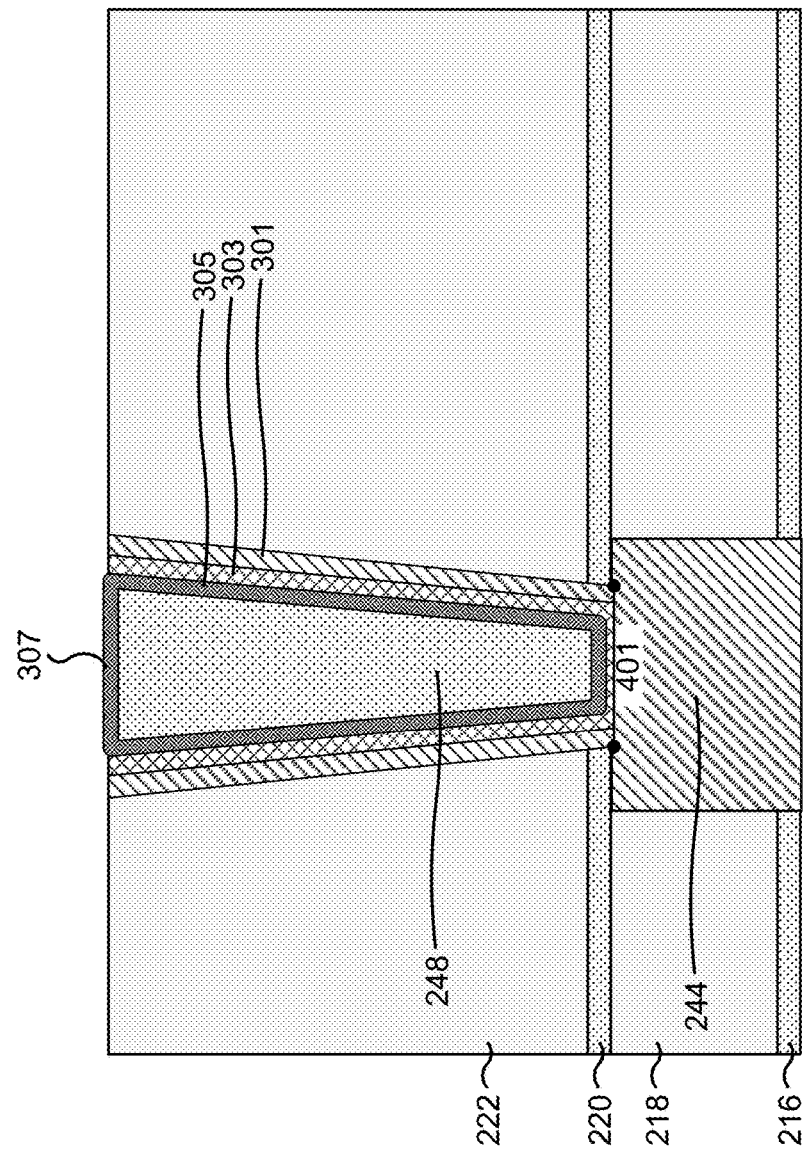
FIGS. 4A and 4B are diagrams of an example implementation described herein.

FIG. 4A illustrates an example semiconductor structure 400 described herein. Semiconductor structure 400 is structurally similar to semiconductor structure 300, described in connection with FIG. 3A, and is dimensioned as a circuit element. FIG. 4A illustrates the conductive structure 248 with a critical dimension represented by a width 401. The width 401 at a bottom surface of the conductive structure 248 may be in a range from approximately 10 nanometers (nm) to approximately 22 nm.

In some implementations, a recessed portion in which the conductive structure 248 is formed (e.g., recessed portion 501 as described in connection with FIGS. 5A-5I) may have a depth that is approximately equal to a thickness of the dielectric layer 222. A ratio of the depth to a thickness of the ESL 220 may be in a range from approximately two to approximately four. Selecting a ratio of at least two ensures that a sufficient volume of the recessed portion is occupied by copper of the conductive structure 248 to reduce resistivity of the conductive structure 248 and/or the ESL 220 is not too thick to prevent the conductive structure 248 from being formed through the ESL 220. Selecting a ratio of no more than four conserves a volume of copper used to form the conductive structure 248 and/or ensures that the ESL 220 is not too thin to stop unwanted etching through the ESL 220 and into the dielectric layer 218. For example, the depth may be in a range from approximately 200 Å to approximately 300 Å, and the thickness of the ESL 220 may be in a range from approximately 80 Å to approximately 120 Å.

Figure 4B:
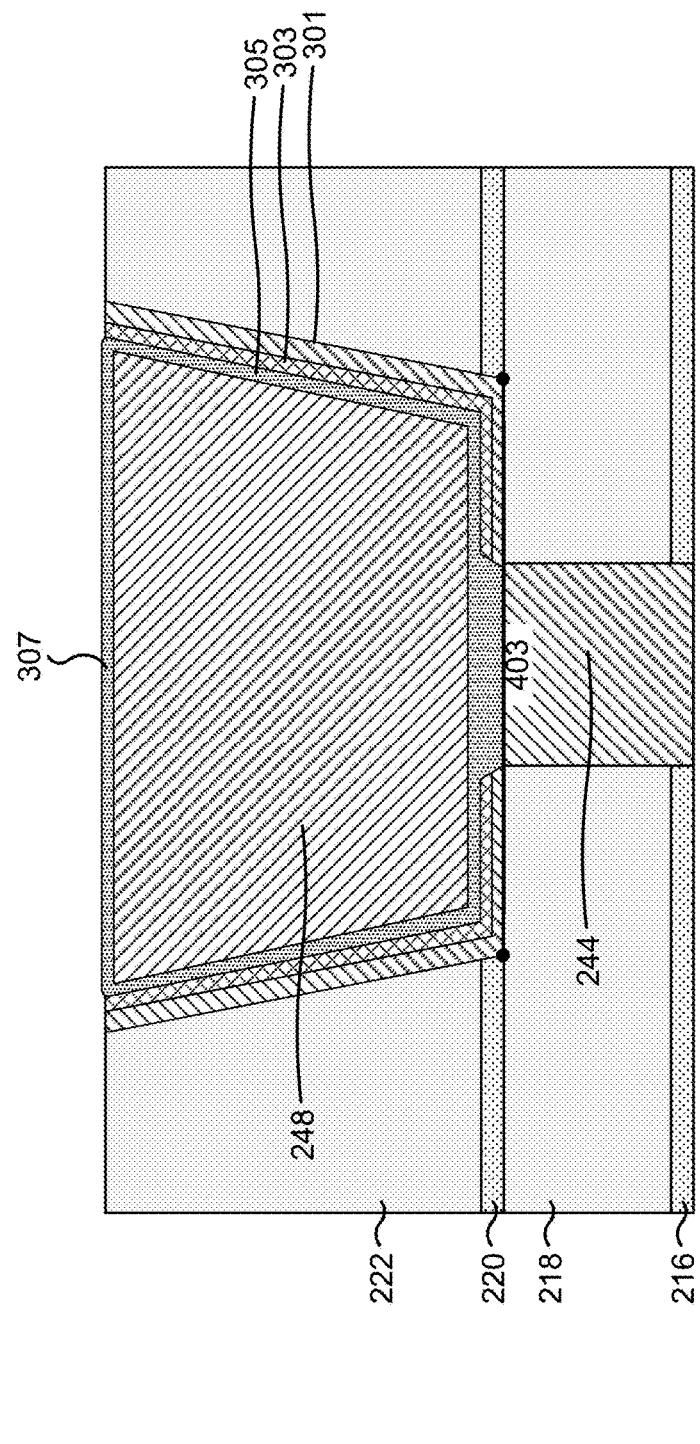

FIG. 4B illustrates an example semiconductor structure 450 described herein. Semiconductor structure 450 is structurally similar to semiconductor structure 300, described in connection with FIG. 3A, and is dimensioned as a seal ring. FIG. 4B illustrates the conductive structure 248 with a critical dimension represented by a width 403. The width 403 at a bottom surface of the conductive structure 248 may be in a range from approximately 100 nm to approximately 180 nm.

Because a blocking layer is selectively deposited on metal surface (e.g., an exposed surface of conductive structure 244), the barrier layer 301 and the first liner layer 303 are present at a bottom portion of the conductive structure 248 that is not at an interface between the conductive structure 248 and the conductive structure 244. As a result, a thickness of the barrier layer 301 above the dielectric 218 is greater than a thickness (if any) of the barrier layer 301 above the conductive structure 244, and a thickness of the first liner layer 303 above the dielectric 218 is greater than a thickness of the first liner layer 303 above the conductive structure 244. In some implementations, a thickness of the barrier layer 301 above the dielectric 218 is approximately the same as a thickness of the barrier layer 301 at a sidewall of the conductive structure 248. Similarly, in some implementations, a thickness of the first liner layer 303 above the dielectric 218 is approximately the same as a thickness of the first liner layer 303 at a sidewall of the conductive structure 248.

As indicated above, FIGS. 4A and 4B are provided as examples. Other examples may differ from what is described with regard to FIGS. 4A and 4B.

FIGS. 5A-5H are diagrams of an example implementation 500 described herein. Example implementation 500 may be an example process for forming a conductive structure 248 over a conductive structure 244 and with a barrier layer 301, a first liner layer 303 (hereinafter referred to as a ruthenium layer 303), and a second liner layer 305 (hereinafter referred to as a cobalt layer 305). The barrier layer 301 is substantially absent from an interface between the conductive structure 248 and the conductive structure 244 in order to reduce contact resistance, which in turn increases electrical performance of an electronic device including the conductive structure 248. Additionally, the ruthenium layer 303 is formed thinner at the interface between the conductive structure 248 and the conductive structure 244 in order to reduce contact resistance, which in turn increases electrical performance of an electronic device including the conductive structure 248.

Figure 5A:
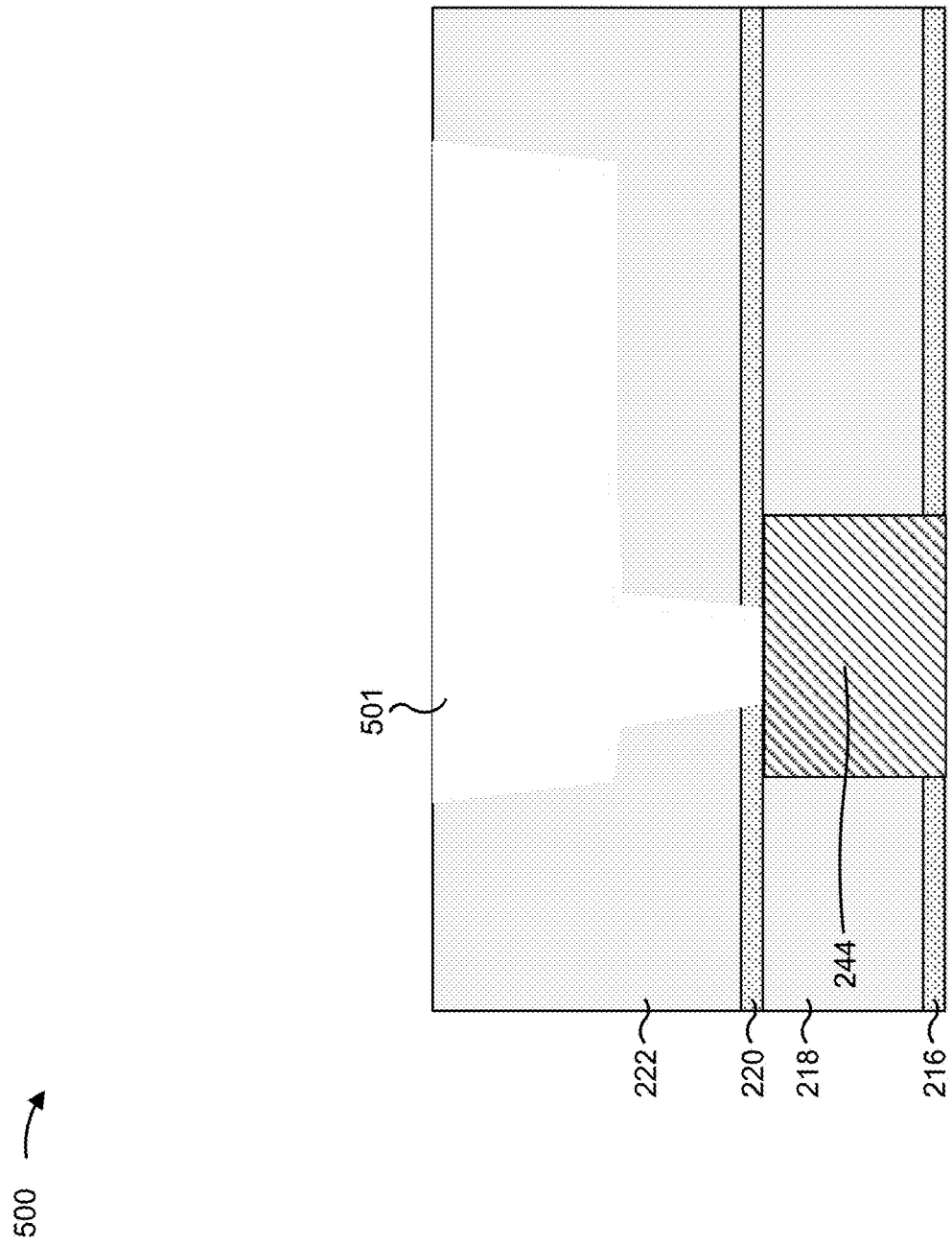

As shown in FIG. 5A, the example process for forming the conductive structure 248 may be performed in connection with an MEOL. In some implementations, the MEOL includes a conductive structure 244 formed in a dielectric layer 218 that is above an ESL 216. Although described with respect to forming the conductive structure 248 over the conductive structure 244 that is connected to a source/drain contact 230 over source/drain 228, the description similarly applies to forming conductive structure 250 over the conductive structure 246 that is connected to a gate contact 242 over gate 232. Additionally, or alternatively, the description similarly applies to higher-layer metallization layers in a BEOL other than the conductive structure 248 and/or the conductive structure 250.

An ESL 220 may be formed over the dielectric layer 218 and the conductive structure 244. The deposition tool 102 may deposit the ESL 220 using a CVD technique, a PVD technique, an ALD technique, or another type of deposition technique. The planarization tool 110 may planarize the ESL 220 after the ESL 220 is deposited.

A dielectric layer 222 may be formed over the ESL 220. For example, the deposition tool 102 may deposit the dielectric layer 222 using a CVD technique, a PVD technique, an ALD technique, or another type of deposition technique. The planarization tool 110 may planarize the dielectric layer 222 after the dielectric layer 222 is deposited.

In some implementations, for a dual damascene profile, an additional ESL may be formed over the dielectric layer 222, and an additional dielectric layer may be formed over the additional ESL in a manner similar to that described above in relation to the ESL 220 and the dielectric layer 222.

As further shown in FIG. 5A, the dielectric layer 222 may be etched to form an opening (resulting in recessed portion 501) such that the conductive structure 244 is at least partially exposed. For example, the deposition tool 102 may form a photoresist layer on the dielectric layer 222 (or on an ESL formed on the dielectric layer 222), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 222 to form the recessed portion 501. In some implementations, a photoresist removal tool removes the remaining portions of the photoresist layer (e.g., using a chemical stripper, a plasma asher, and/or another technique) after the etch tool 108 etches the recessed portion 501. For a dual damascene profile, as shown in FIG. 5A, the recessed portion 501 may be formed using at least two separate etching steps.

Figure 5B:
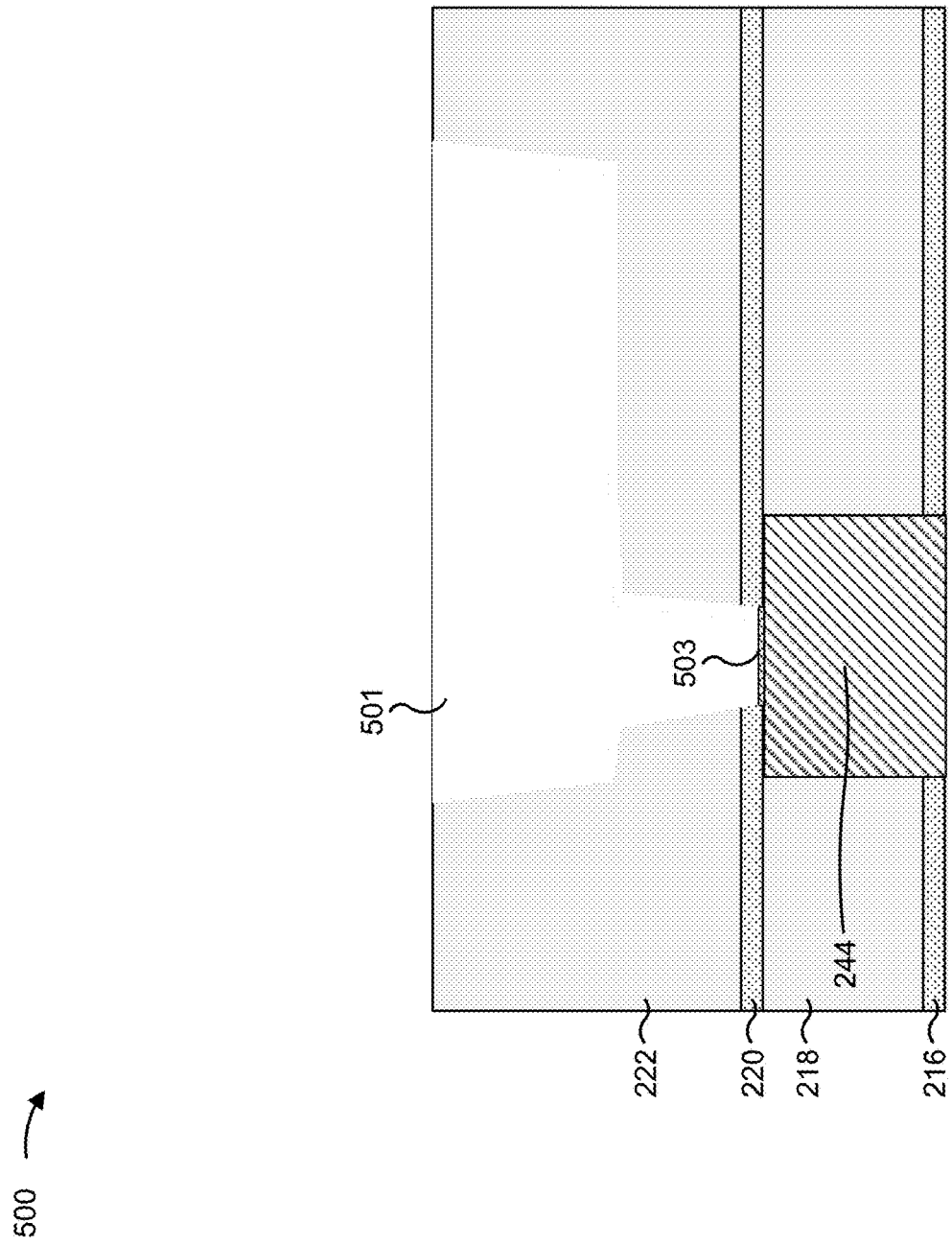

As shown in FIG. 5B, a blocking layer 503 may be formed on a bottom surface of the recessed portion 501. The deposition tool 102 may deposit the blocking layer 503 using a CVD technique, a PVD technique, an ALD technique, or another type of deposition technique. In some implementations, the blocking layer 503 includes benzotriazole, 5-Decyne, and/or another material that includes one portion that bonds to copper and another portion that repels a barrier material. The blocking layer 503 may selectively deposit on an exposed portion of the conductive structure 244 and not on the dielectric layer 222 because one or more chemicals comprising the blocking layer 503 (and/or one or more precursor materials used to deposit the blocking layer 503) bind with copper and does not bind to dielectric layer 222.

Figure 5C:
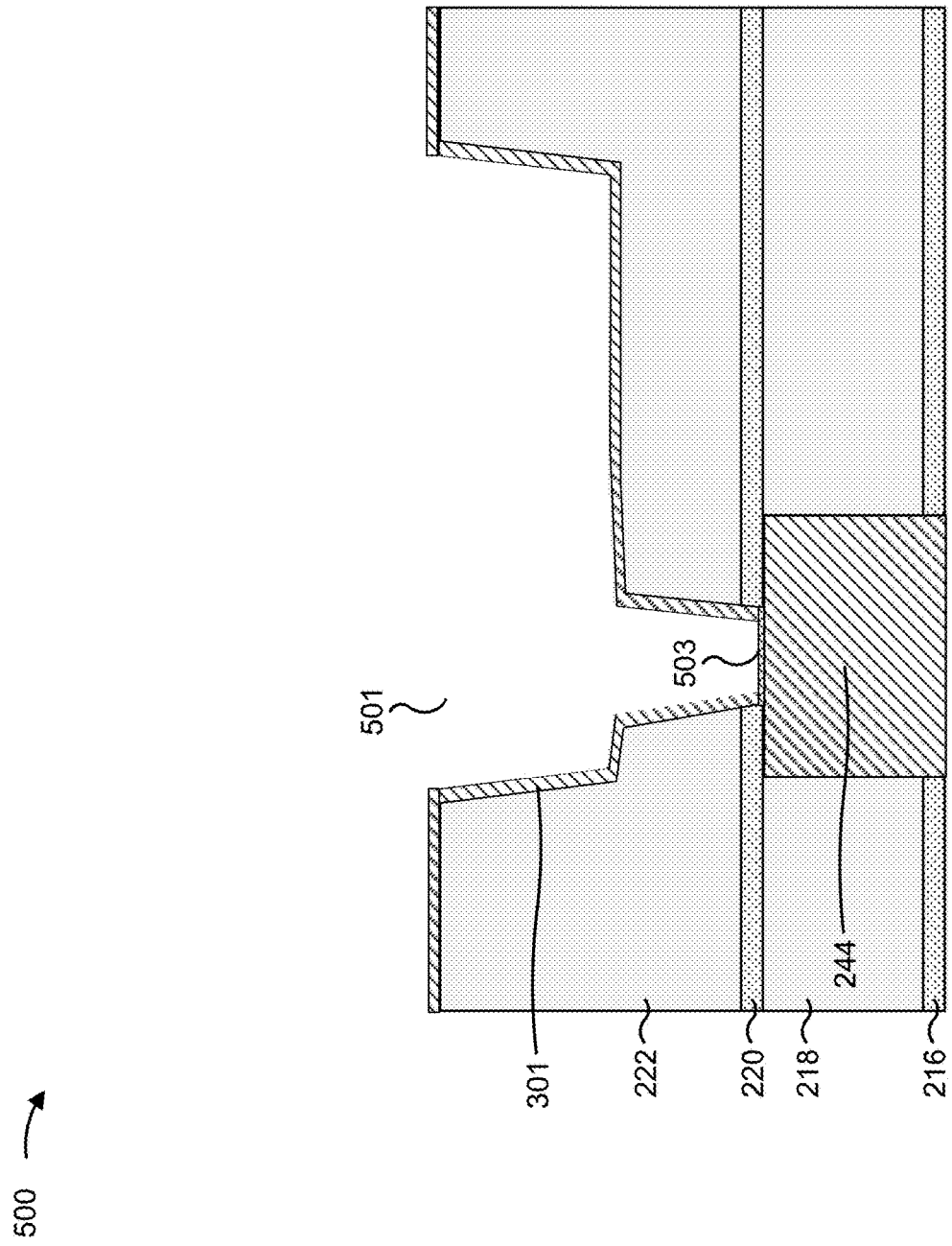

As shown in FIG. 5C, a barrier layer 301 may be formed on sidewalls of the recessed portion 501. The deposition tool 102 may deposit the barrier layer 301 using a CVD technique, a PVD technique, an ALD technique, or another type of deposition technique. As described above, the blocking layer 503 repels the barrier layer 301 such that the barrier layer 301 is deposited (e.g., via epitaxial growth) on the sidewalls and not on the bottom surface. In some implementations, as shown in FIG. 5C, the barrier layer 301 is deposited on a top surface of the dielectric layer 222 as well.

Figure 5D:
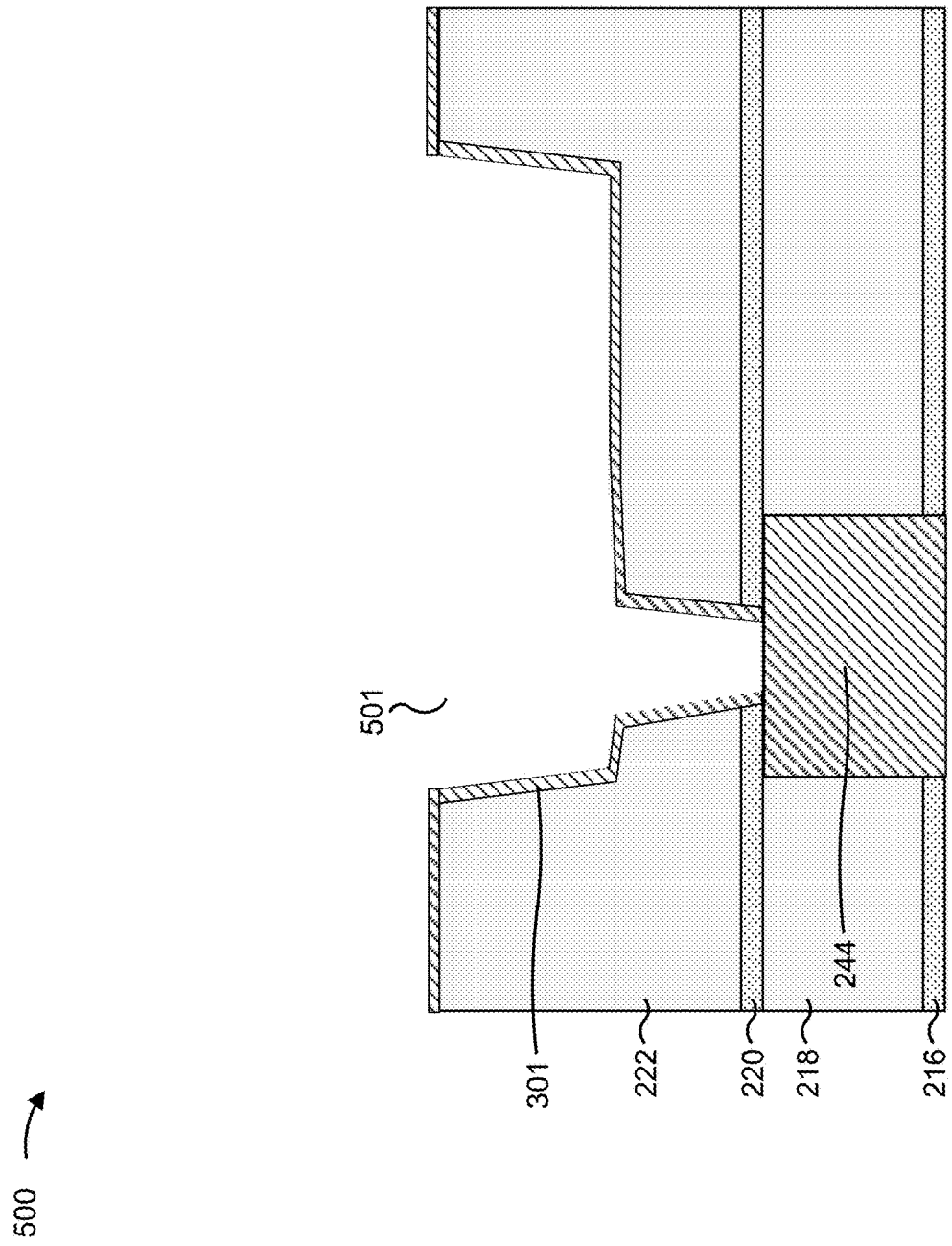

As shown in FIG. 5D, the blocking layer 503 may be etched. In some implementations, the etch tool 108 performs dry etching using a plasma, such as a hydrogen ($H_2$) or ammonia ($NH_3$) plasma. The plasma may chemically interact with the blocking layer 503 and not with the barrier layer 301. Accordingly, the etch tool 108 may etch the blocking layer 503 and not other layers.

Figure 5E:
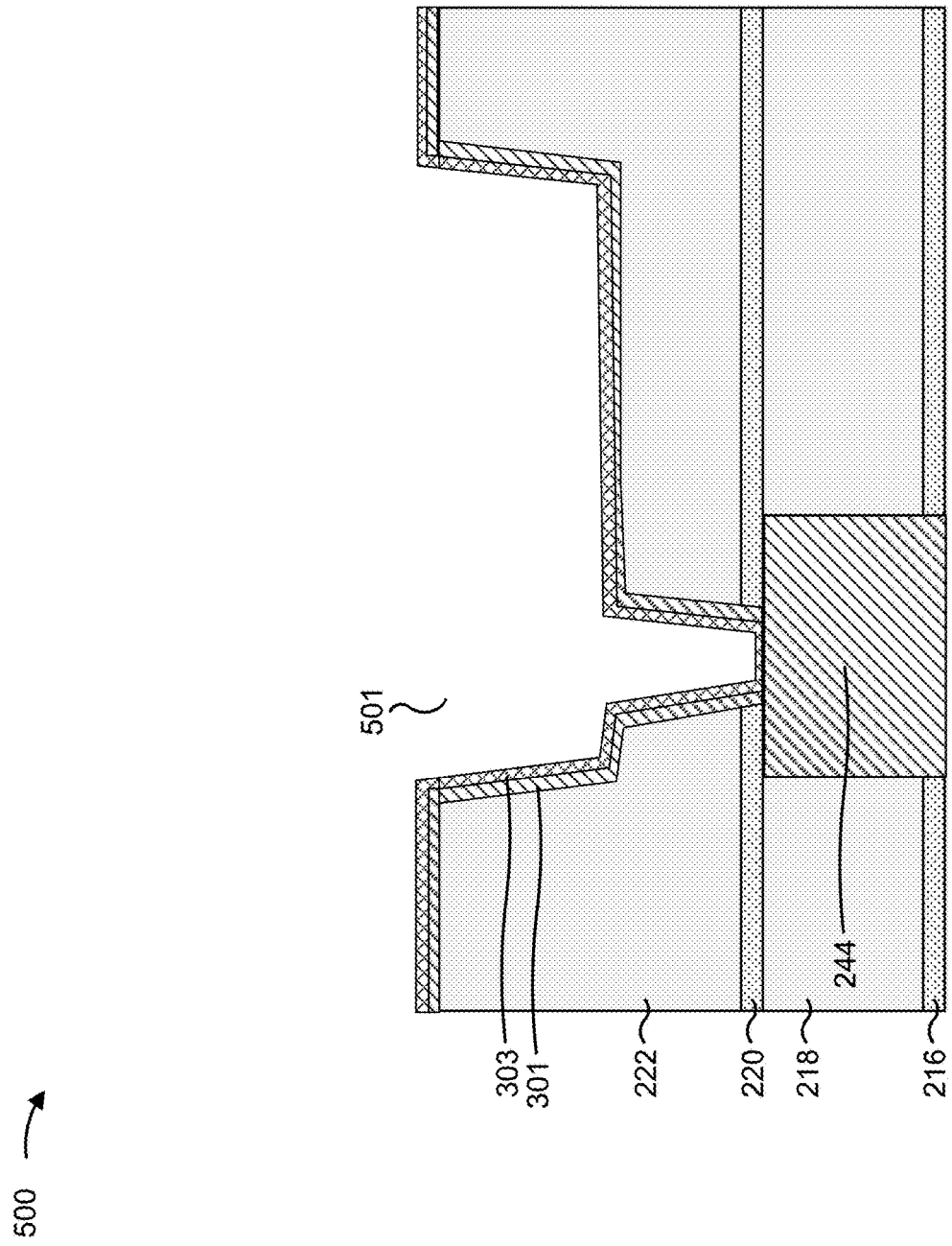

As shown in FIG. 5E, a ruthenium layer 303 may be formed over the sidewalls and the bottom surface of the recessed portion 501. The deposition tool 102 may deposit the ruthenium layer 303 using a CVD technique, a PVD technique, an ALD technique, or another type of deposition technique. As described above, the blocking layer 503 repels the ruthenium layer 303 such that the ruthenium layer 303 is thicker on the sidewalls as compared with the bottom surface.

As further shown in FIG. 5E, the ruthenium layer 303 is also formed on the bottom surface of the recessed portion 501. However, ruthenium has a slower deposition rate over copper as compared with the barrier layer 301. For example, ruthenium deposits approximately three times faster over the barrier layer 301 as compared with copper using CVD in a range from approximately 200° C. to approximately 300° C. with a vacuum in a range from approximately 5 torr to approximately 35 torr. Accordingly, the ruthenium layer 303 is thinner on the bottom surface as compared with the sidewalls. In some implementations, as shown in FIG. 5E, the ruthenium layer 303 is deposited on the top surface of the dielectric layer 222 as well.

Regardless, some blocking material, of the blocking layer 503, may remain at the bottom surface of the recessed portion 501. Accordingly, trace amounts of benzotriazole, 5-Decyne, and/or another blocking material may be detectable at an interface between the conductive structure 244 and the conductive structure 248.

Figure 5F:
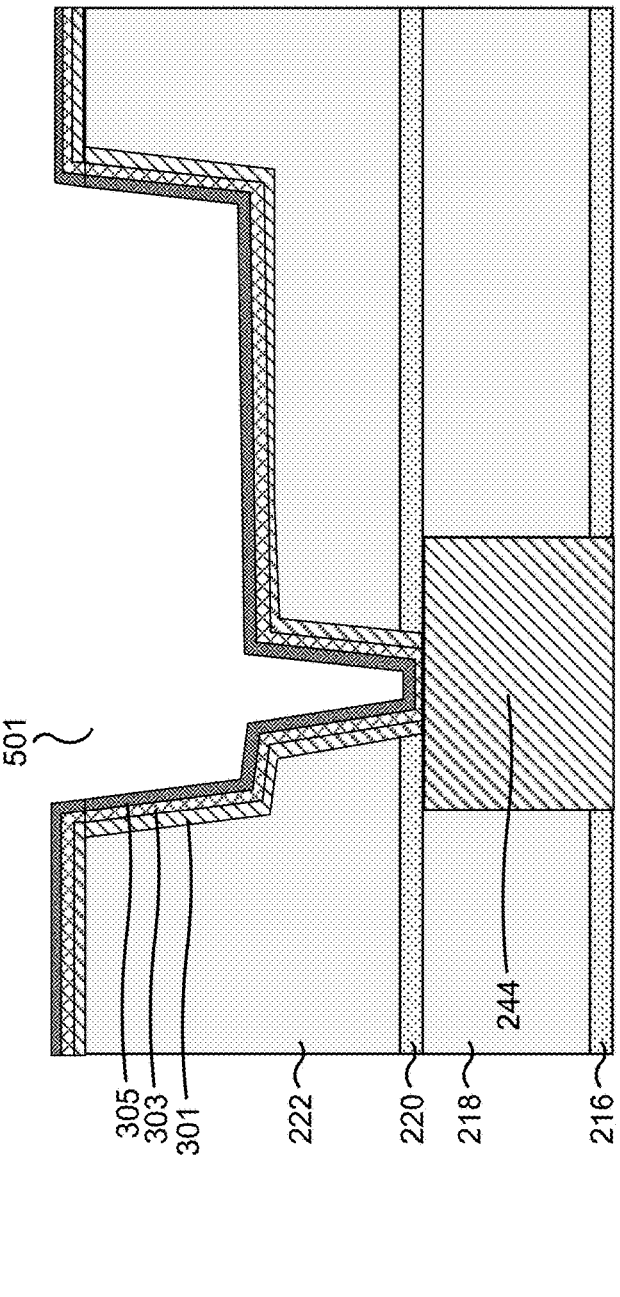

As shown in FIG. 5F, a cobalt layer 305 may be formed over the sidewalls and the bottom surface of the recessed portion 501. The deposition tool 102 may deposit the cobalt layer 305 using a CVD technique, a PVD technique, an ALD technique, or another type of deposition technique. As described above, the cobalt layer 305 may help the sheet resistance of the conductive structure 248. In some implementations, as shown in FIG. 5F, the cobalt layer 305 is deposited on the top surface of the dielectric layer 222 as well.

As shown in FIG. 5G, the conductive structure 248 may be formed in the recessed portion 501 and over the barrier layer 301, the ruthenium layer 303, and the cobalt layer 305. The deposition tool 102 may deposit copper of the conductive structure 248 using a CVD technique, a PVD technique, an ALD technique, or another type of deposition technique, the plating tool 112 may deposit the copper of the conductive structure 248 using an electroplating operation, or a combination thereof.

Figure 5H:
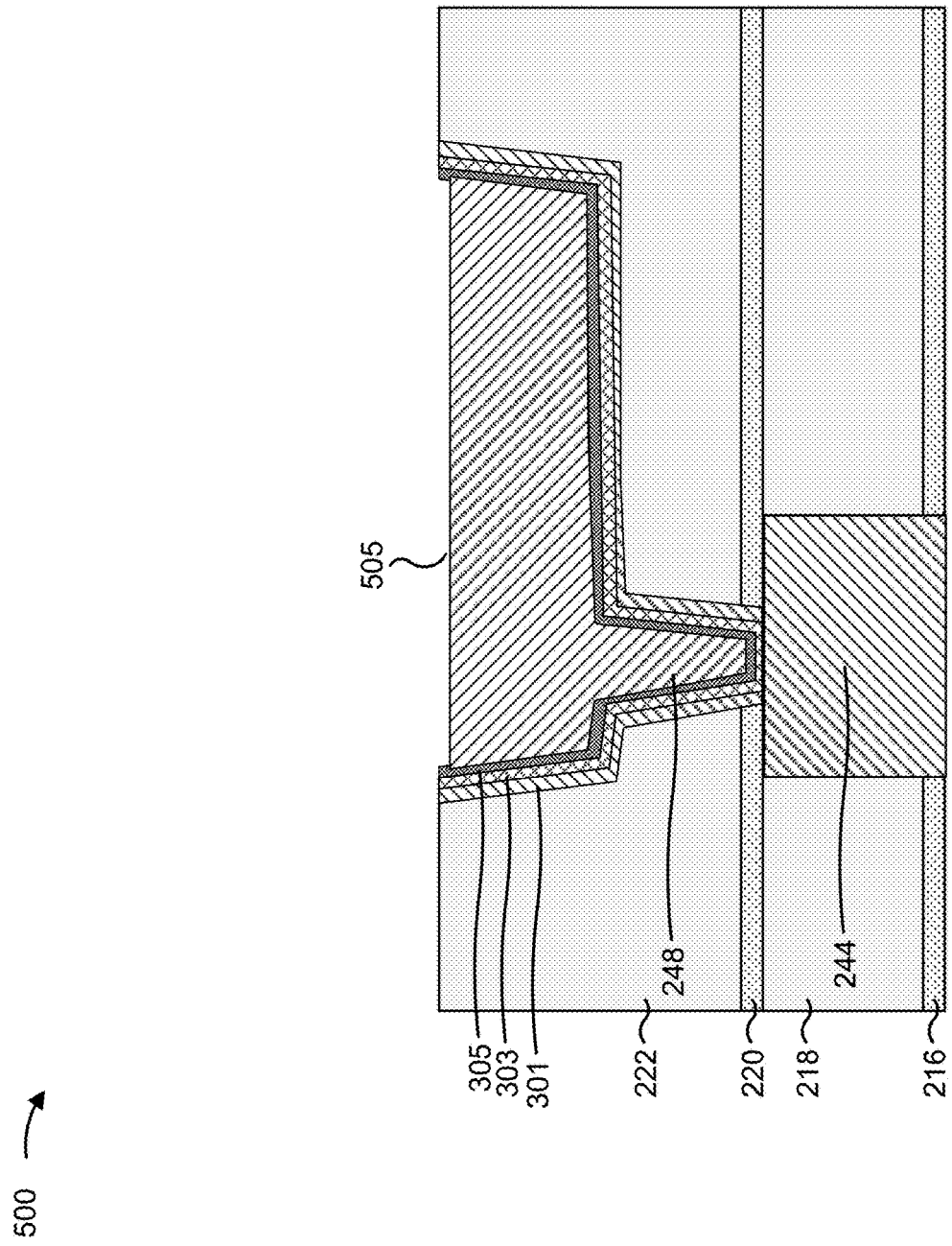

In some implementations, the copper flows over the top surface of the dielectric layer 222 as well as into the recessed portion 501. Accordingly, as shown in FIG. 5H, the conductive structure 248 may be planarized. The planarization tool 110 may planarize the conductive structure 248 after the conductive structure 248 is deposited. Additionally, portions of the barrier layer 301 (and any portions of the ruthenium layer 303 and/or the cobalt layer 305) deposited over the top surface of the dielectric layer 222 may be removed during planarization. In some implementations, the planarization tool 110 uses a CMP.

Figure 5I:
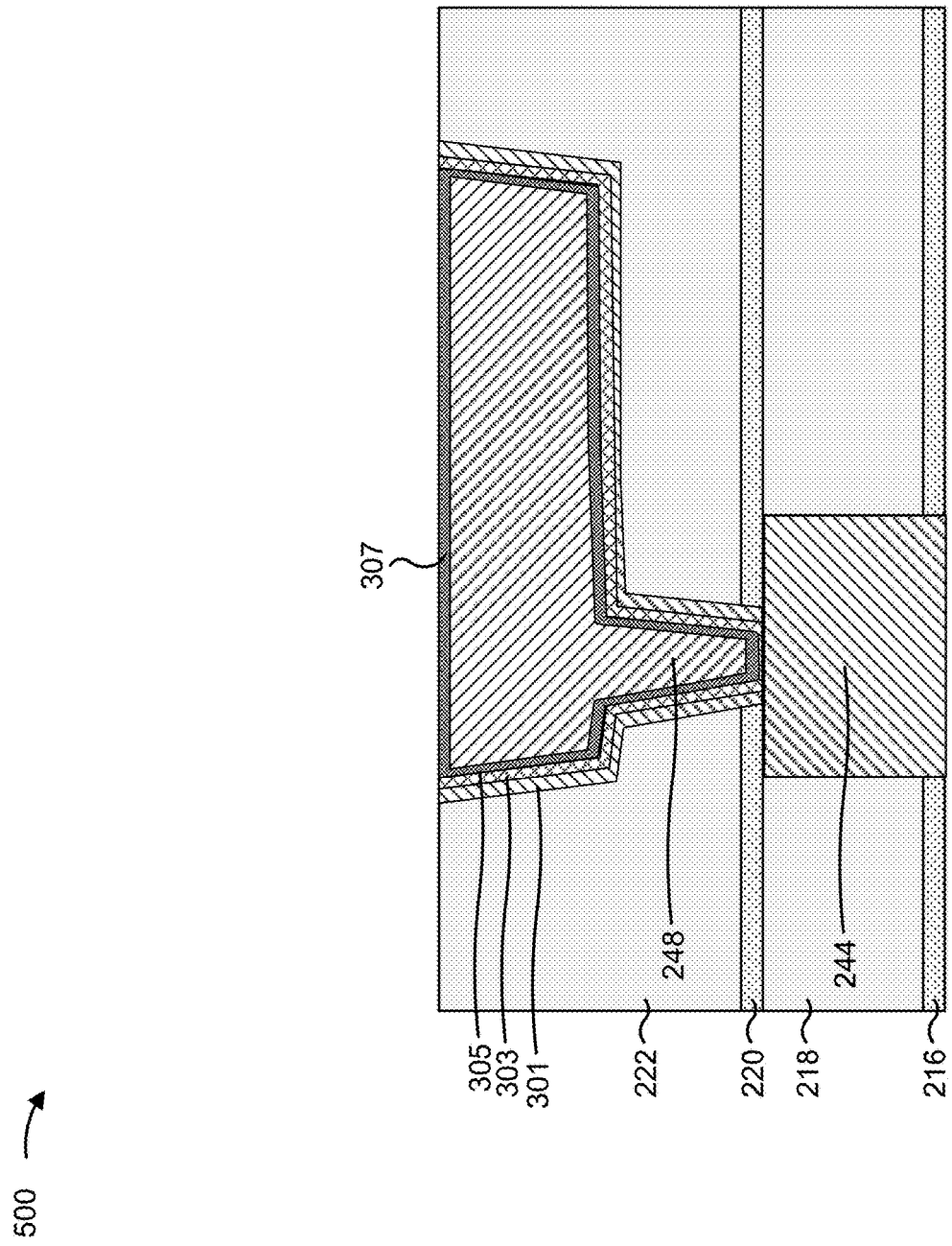

Using a CMP may cause a recessed portion 505 to form in the conductive structure 248 due to dishing. Accordingly, as shown in FIG. 5I, a cobalt cap 307 may be formed in the recessed portion 505 and on a top surface of the conductive structure 248. The deposition tool 102 may deposit the cobalt cap 307 by a CVD technique, a PVD technique, an ALD technique, or another type of deposition technique.

By using techniques as described in connection with FIGS. 5A-5I, the barrier layer 301 prevents diffusion of copper from the conductive structure 248, which reduces resistivity of the conductive structure 244, and the ruthenium layer 303 improves a flow of copper into the recessed portion 501, and the barrier layer 301 is substantially absent from, and the ruthenium layer 303 is thinner at, the bottom surface of the recessed portion 501 as compared with the sidewalls in order to reduce contact resistance between the conductive structure 248 and the conductive structure 244.

As indicated above, FIGS. 5A-5I are provided as an example. Other examples may differ from what is described with regard to FIGS. 5A-5I. For example, in some implementations, the cobalt layer 305 may be omitted (e.g., as described in connection with FIG. 3B).

Figure 6:
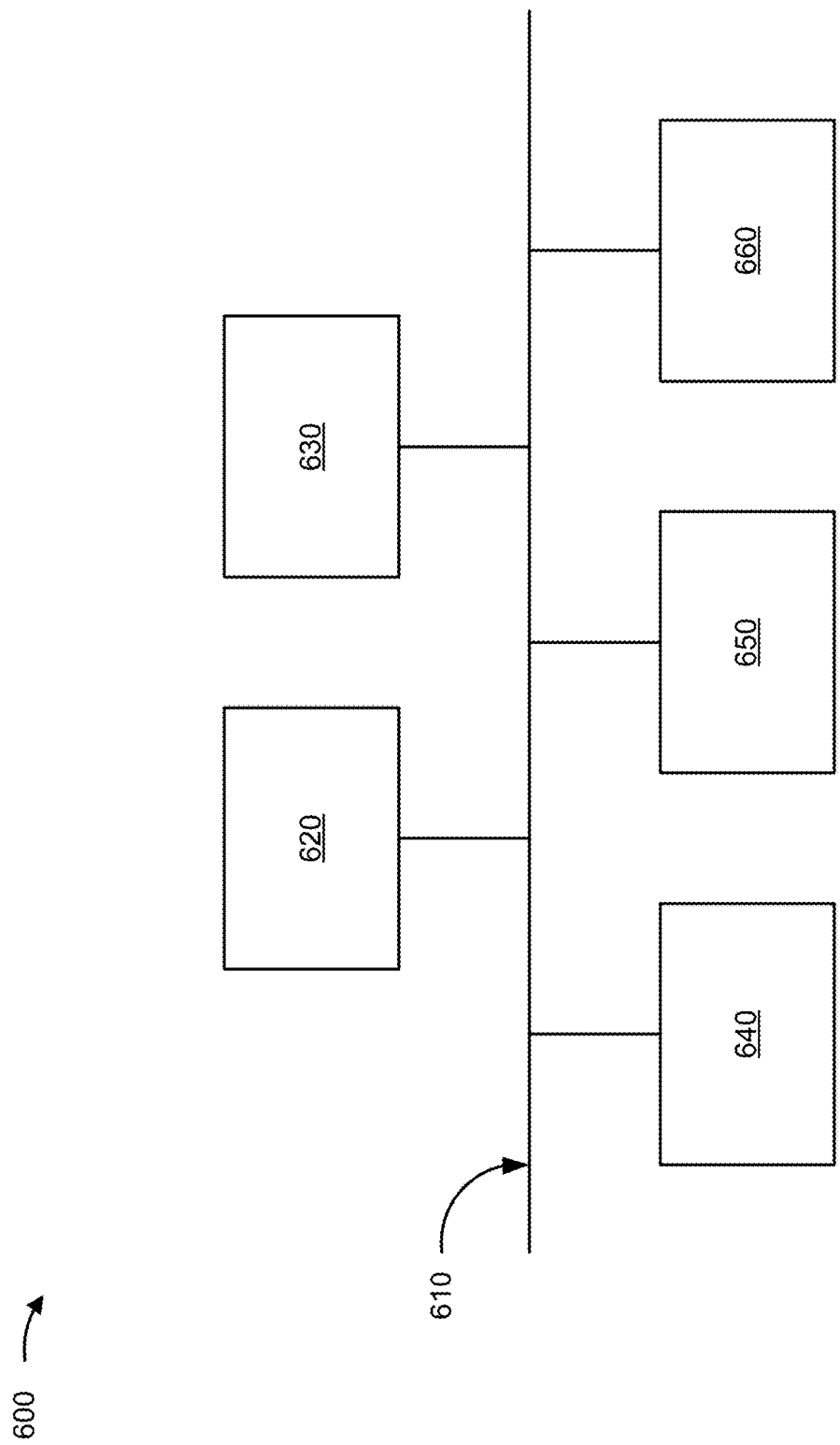
FIG. 6 is a diagram of example components of one or more devices of FIG. 1 described herein.

FIG. 6 is a diagram of example components of a device 600. In some implementations, one or more of the semiconductor processing tools 102-114 and/or the wafer/die transport tool 116 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
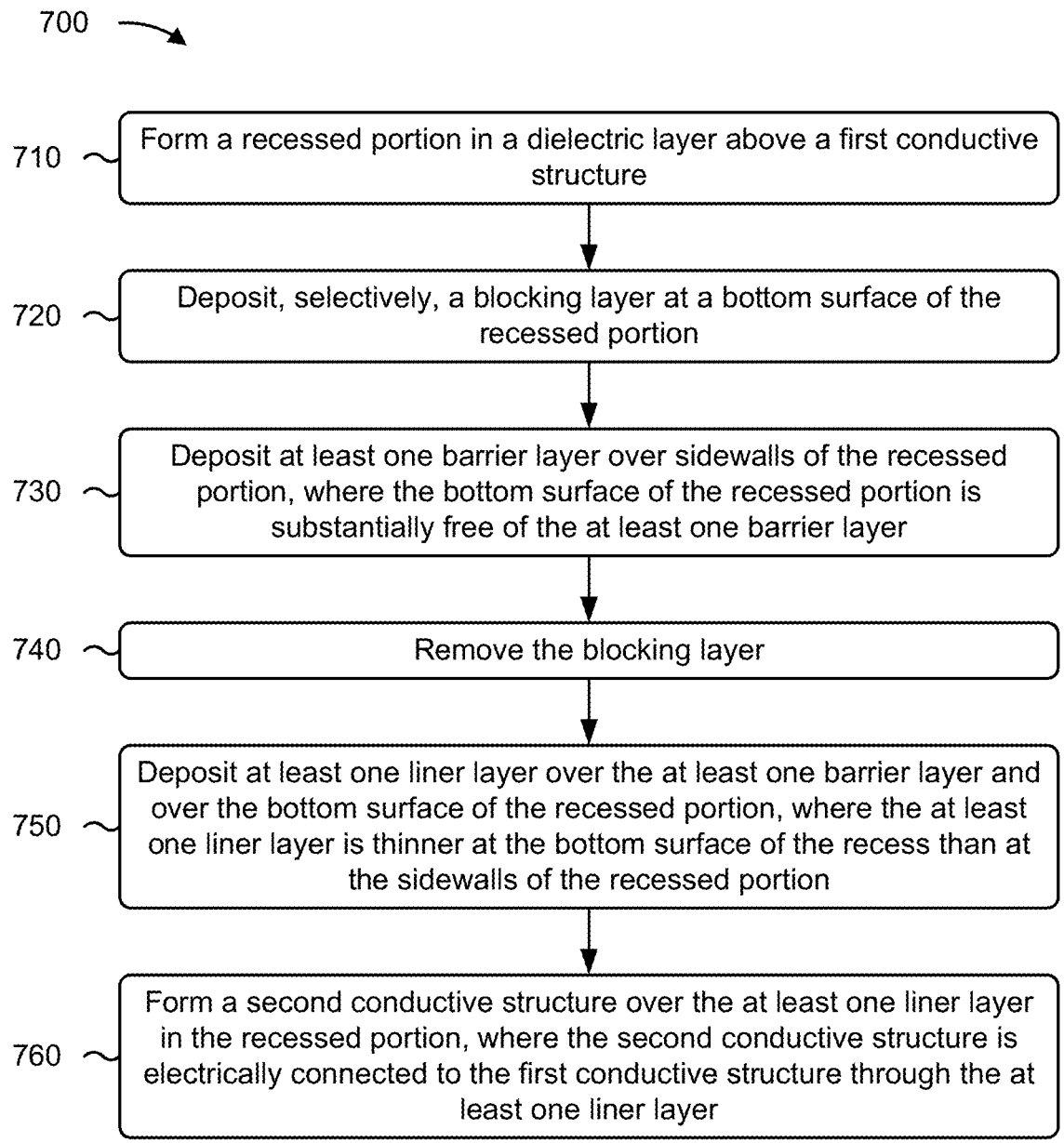
FIG. 7 is a flowchart of an example process associated with forming conductive structures described herein.

FIG. 7 is a flowchart of an example process 700 relating to forming conductive structures described herein. In some implementations, one or more process blocks of FIG. 7 may be performed by one or more semiconductor processing tools (e.g., one or more of the semiconductor processing tools 102-114). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a recessed portion in a dielectric layer above a first conductive structure (block 710). For example, the one or more semiconductor processing tools 102-114 may form a recessed portion 501 in a dielectric layer 222 above a first conductive structure 244, as described herein.

As further shown in FIG. 7, process 700 may include depositing, selectively, a blocking layer at a bottom surface of the recessed portion (block 720). For example, the one or more semiconductor processing tools 102-114 may deposit, selectively, a blocking layer 503 at a bottom surface of the recessed portion 501, as described herein.

As further shown in FIG. 7, process 700 may include depositing at least one barrier layer over sidewalls of the recessed portion (block 730). For example, the one or more semiconductor processing tools 102-114 may deposit at least one barrier layer 301 over sidewalls of the recessed portion 501, as described herein. In some implementations, the bottom surface of the recessed portion 501 is substantially free of the at least one barrier layer 301.

As further shown in FIG. 7, process 700 may include removing the blocking layer (block 740). For example, the one or more semiconductor processing tools 102-114 may remove the blocking layer 503, as described herein.

As further shown in FIG. 7, process 700 may include depositing at least one liner layer over the at least one barrier layer and over the bottom surface of the recessed portion (block 750). For example, the one or more semiconductor processing tools 102-114 may deposit at least one liner layer 303 over the at least one barrier layer 301 and over the bottom surface of the recessed portion 501, as described herein. In some implementations, the at least one liner layer 303 is thinner at the bottom surface of the recessed portion 501 than at the sidewalls of the recessed portion 501.

As further shown in FIG. 7, process 700 may include forming a second conductive structure over the at least one liner layer in the recessed portion, wherein the second conductive structure is electrically connected to the first conductive structure through the at least one liner layer (block 760). For example, the one or more semiconductor processing tools 102-114 may form a second conductive structure 248 over the at least one liner layer 303 in the recessed portion 501, as described herein. In some implementations, the second conductive structure 248 is electrically connected to the first conductive structure 244 through the at least one liner layer 303.

Process 700 may include additional implementations, such as any single implementation or any combination of implementations described below and/or in connection with one or more other processes described elsewhere herein.

In a first implementation, forming the recessed portion 501 including forming the recessed portion 501 using a dual damascene process, such that the recessed portion 501 includes a first portion and a second portion, the first portion being lower in the dielectric layer 222 relative to the second portion.

In a second implementation, alone or in combination with the first implementation, the at least one barrier layer 301 is deposited on at least a portion of a top surface of the dielectric layer 222.

In a third implementation, alone or in combination with one or more of the first and second implementations, process 700 further includes etching the at least one barrier layer 301 from the top surface of the dielectric layer 222.

In a fourth implementation, alone or in combination with one or more of the first through third implementations, the at least one liner layer 303 is deposited on at least a portion of a top surface of the dielectric layer 222.

In a fifth implementation, alone or in combination with one or more of the first through fourth implementations, process 700 further includes etching the at least one liner layer 303 from the top surface of the dielectric layer 222.

In a sixth implementation, alone or in combination with one or more of the first through fifth implementations, removing the blocking layer 503 includes etching the blocking layer 503 using a hydrogen or ammonia plasma.

In a seventh implementation, alone or in combination with one or more of the first through sixth implementations, forming the second conductive structure 248 includes flowing copper into the recessed portion 501, and planarizing the copper using CMP.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

In this way, a blocking material is selectively deposited on a bottom surface of a BEOL conductive structure such that a barrier layer is selectively deposited on sidewalls of the BEOL conductive structure and not on the bottom surface. The blocking material is etched such that copper from a conductive structure underneath is exposed, and a ruthenium layer is deposited on the barrier layer and a lesser amount on the exposed copper. The barrier layer prevents diffusion of metal ions from the BEOL conductive structure and is substantially absent from the bottom surface as compared to the sidewalls in order to reduce contact resistance. Additionally, the ruthenium layer reduces surface roughness within the BEOL conductive structure and is thinner at the bottom surface as compared to the sidewalls in order to reduce contact resistance.

As described in greater detail above, some implementations described herein provide a semiconductor structure. The semiconductor structure includes at least one barrier layer over sidewalls of a recessed portion of a dielectric layer, wherein a bottom surface of the recessed portion is substantially free of the at least one barrier layer. The semiconductor structure further includes at least one liner layer over the at least one barrier layer and over the bottom surface of the recessed portion, wherein a thickness of the at least one liner layer is thinner at the bottom surface of the recessed portion than at the sidewalls of the recessed portion. The semiconductor structure includes a conductive structure comprising copper over the at least one liner layer and substantially filling a remainder of the recessed portion.

As described in greater detail above, some implementations described herein provide a method. The method includes forming a recessed portion in a dielectric layer above a first conductive structure. The method further includes depositing, selectively, a blocking layer at a bottom surface of the recessed portion. The method includes depositing at least one barrier layer over sidewalls of the recessed portion, wherein the bottom surface of the recessed portion is substantially free of the at least one barrier layer. The method further includes removing the blocking layer. The method includes depositing at least one liner layer over the at least one barrier layer and over the bottom surface of the recessed portion, wherein the at least one liner layer is thinner at the bottom surface of the recessed portion than at the sidewalls of the recessed portion. The method further includes forming a second conductive structure over the at least one liner layer in the recessed portion, wherein the second conductive structure is electrically connected to the first conductive structure through the at least one liner layer.

As described in greater detail above, some implementations described herein provide a semiconductor device. The semiconductor device includes a first recessed portion in a first dielectric layer and a second recessed portion in a second dielectric layer above the first dielectric layer. The semiconductor device further includes a first conductive structure formed in the first recessed portion and at least one liner layer that has a first thickness at sidewalls of the second recessed portion and a second thickness at a bottom surface of the second recessed portion, and the second thickness is no more than 60% of the first thickness. The semiconductor device includes at least one barrier layer under the at least one liner layer. The semiconductor device further includes a second conductive structure electrically connected to the first conductive structure and formed on the at least one liner layer in the second recessed portion, where the at least one liner layer physically contacts the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a recessed portion in a dielectric layer above a first conductive structure;
   depositing, selectively, a blocking layer at a bottom surface of the recessed portion;
   depositing at least one barrier layer over sidewalls of the recessed portion, wherein the bottom surface of the recessed portion is substantially free of the at least one barrier layer;
   removing the blocking layer;
   depositing, after removing the blocking layer, at least one liner layer over the at least one barrier layer and over the bottom surface of the recessed portion, wherein the at least one liner layer is thinner at the bottom surface of the recessed portion than at the sidewalls of the recessed portion; and
   forming a second conductive structure over the at least one liner layer in the recessed portion, wherein the second conductive structure is electrically connected to the first conductive structure through the at least one liner layer.

2. The method of claim 1, wherein forming the recessed portion comprises:
   forming the recessed portion using a dual damascene process, wherein the recessed portion includes a first portion and a second portion, the first portion being lower in the dielectric layer relative to the second portion.

3. The method of claim 1, wherein the at least one barrier layer is deposited on at least a portion of a top surface of the dielectric layer.

4. The method of claim 3, further comprising:
   etching the at least one barrier layer from the top surface of the dielectric layer.

5. The method of claim 1, wherein the at least one liner layer is deposited on at least a portion of a top surface of the dielectric layer.

6. The method of claim 5, further comprising:
   etching the at least one liner layer from the top surface of the dielectric layer.

7. The method of claim 1, wherein removing the blocking layer comprises:
   etching the blocking layer using a hydrogen or ammonia plasma.

8. The method of claim 1, wherein forming the second conductive structure comprises:
   flowing copper into the recessed portion; and
   planarizing the copper using a chemical mechanical planarization (CMP).

9. A method, comprising:
   forming a recessed portion in a dielectric layer;
   depositing a blocking layer at a bottom surface of the recessed portion;
   depositing at least one barrier layer over sidewalls of the recessed portion;
   removing the blocking layer;
   depositing, after removing the blocking layer, at least one liner layer over the at least one barrier layer and over the bottom surface of the recessed portion; and
   forming a conductive structure over the at least one liner layer.

10. The method of claim 9, further comprising:
    planarizing the conductive structure.

11. The method of claim 10, wherein a portion of the at least one barrier layer, formed over the dielectric layer, is removed based on planarizing the conductive structure.

12. The method of claim 10, wherein a recessed portion is formed in the conductive structure based on planarizing the conductive structure.

13. The method of claim 12, further comprising:
    forming a cap in the recessed portion of the conductive structure.

14. The method of claim 13, wherein the cap comprises cobalt.

15. The method of claim 13, wherein the cap is formed on a top surface of the conductive structure.

16. A method, comprising:
    forming a recessed portion in a dielectric layer;
    depositing a blocking layer at a bottom surface of the recessed portion;
    depositing at least one barrier layer over sidewalls of the recessed portion;
    removing the blocking layer;
    depositing, after removing the blocking layer, a first liner layer over the at least one barrier layer and over the bottom surface of the recessed portion,
      wherein the first liner layer is thinner at the bottom surface of the recessed portion than at the at least one barrier layer;
    depositing at least one second liner layer over the first liner layer; and
    forming a conductive structure over the at least one second liner layer.

17. The method of claim 16, further comprising:
    forming a recessed portion in the conductive structure.

18. The method of claim 17, further comprising:
    forming a cap in the recessed portion of the conductive structure.

19. The method of claim 18, wherein the cap is formed on a top surface of the conductive structure.

20. The method of claim 17, wherein a portion of the at least one barrier layer, a portion of the first liner layer, and a portion of the at least one second liner layer formed over the dielectric layer are removed based on forming the recessed portion in the conductive structure.

* * * * *